United States Patent
Amano et al.

(10) Patent No.: US 10,128,137 B2
(45) Date of Patent: Nov. 13, 2018

(54) MANAGEMENT METHOD OF SUBSTRATE PROCESSING APPARATUS AND SUBSTRATE PROCESSING SYSTEM

(71) Applicant: Tokyo Electron Limited, Tokyo (JP)

(72) Inventors: Yoshifumi Amano, Koshi (JP); Satoshi Morita, Koshi (JP); Ryoji Ikebe, Koshi (JP); Isamu Miyamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/454,346

(22) Filed: Mar. 9, 2017

(65) Prior Publication Data

US 2017/0287750 A1   Oct. 5, 2017

(30) Foreign Application Priority Data

Mar. 30, 2016   (JP) .................... 2016-068212

(51) Int. Cl.
*H01L 21/67* (2006.01)
*H01L 21/66* (2006.01)
*H01L 21/68* (2006.01)

(52) U.S. Cl.
CPC .. *H01L 21/67253* (2013.01); *H01L 21/67028* (2013.01); *H01L 21/67132* (2013.01); *H01L 21/67259* (2013.01); *H01L 21/67288* (2013.01); *H01L 21/681* (2013.01); *H01L 22/20* (2013.01); *H01L 22/12* (2013.01)

(58) Field of Classification Search
None
See application file for complete search history.

(56) References Cited

U.S. PATENT DOCUMENTS

| | | | |
|---|---|---|---|
| 2015/0248127 A1* | 9/2015 | Yang | G05B 19/418 700/121 |
| 2016/0211151 A1* | 7/2016 | Tsubota | H01L 21/67069 |
| 2016/0365264 A1* | 12/2016 | Tokunobu | H01L 21/67017 |
| 2016/0372345 A1* | 12/2016 | Nakaharada | H01L 21/67046 |
| 2016/0372346 A1* | 12/2016 | Nakaharada | H01L 21/67046 |
| 2017/0283977 A1* | 10/2017 | Iino | C25D 7/12 |
| 2017/0287699 A1* | 10/2017 | Fujita | H01L 21/68764 |
| 2017/0287704 A1* | 10/2017 | Amano | H01L 21/02087 |

FOREIGN PATENT DOCUMENTS

JP    2013-168429 A    8/2013

* cited by examiner

*Primary Examiner* — Asok K Sarkar
(74) *Attorney, Agent, or Firm* — Pearne & Gordon LLP

(57) ABSTRACT

A measurement processing process S103 of measuring a cut width of a film based on an image obtained by imaging, with an imaging unit 270, a peripheral portion of a substrate which is processed based on a substrate processing recipe; a creation process S602 of creating a management list in which a set value of the cut width of the film, a measurement value of the cut width of the film measured through the measurement processing process and time information at which the measurement result is obtained are correlated; an analysis process S603 (S606) of analyzing a state of the processed substrate based on the created management list; and a notification process S605 (S608, S609) of making a preset notification to a user based on an analysis result obtained through the analysis process are provided.

15 Claims, 22 Drawing Sheets

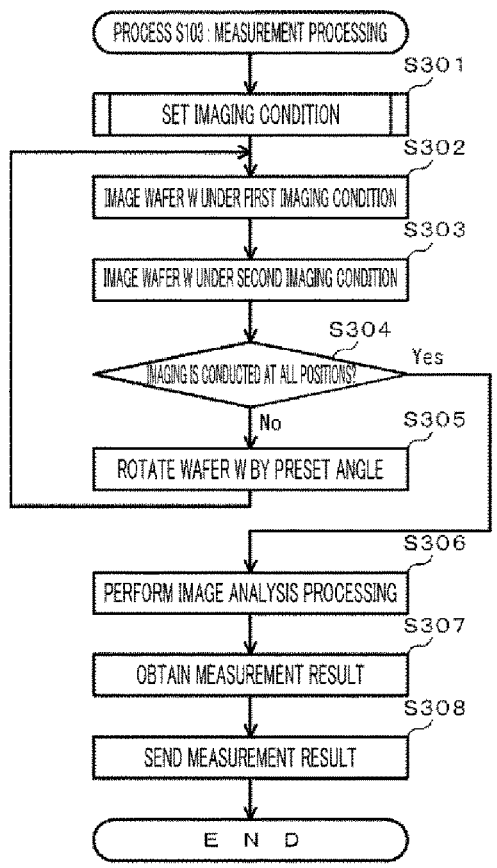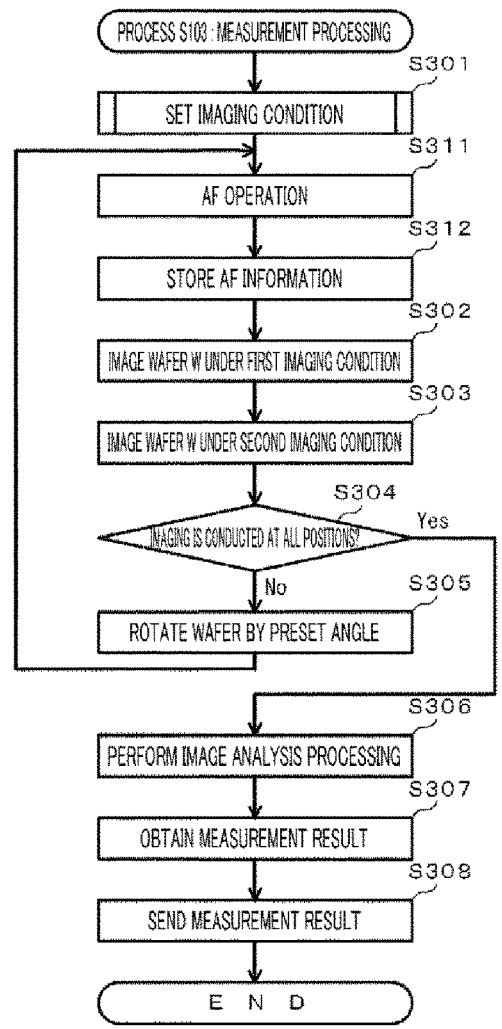
FIG. 12A
FIG. 12B

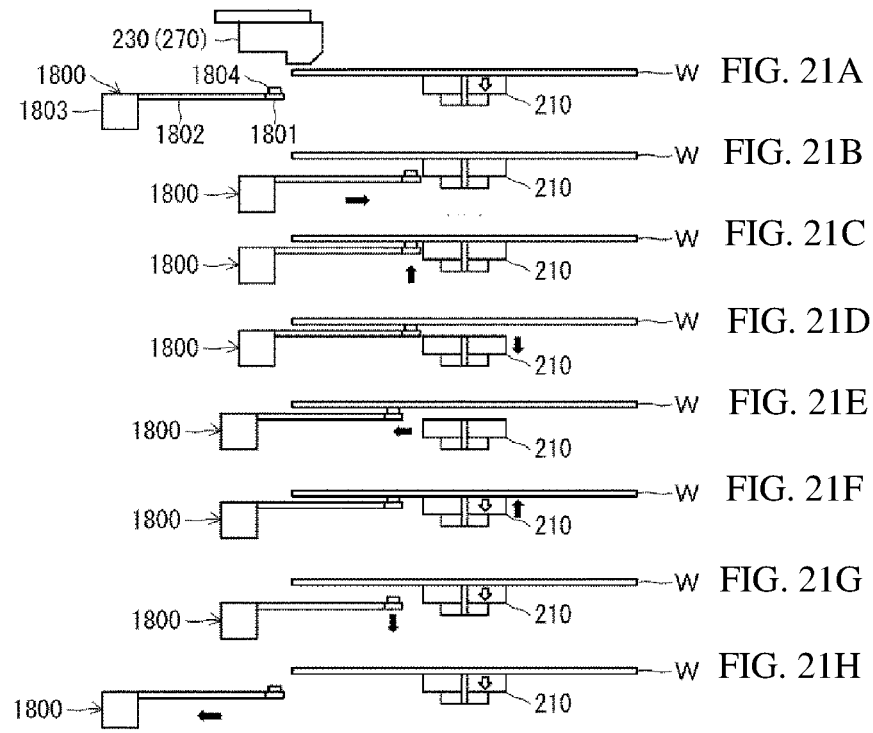

FIG. 23

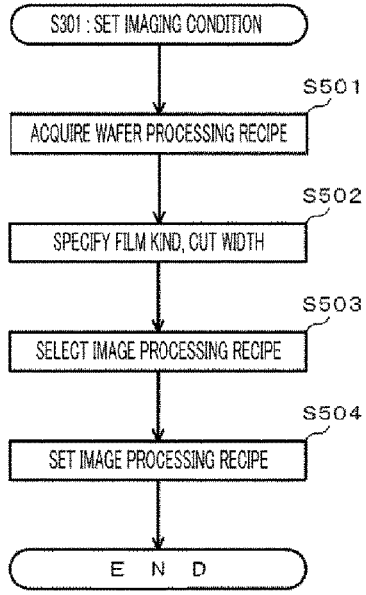

S301: SET IMAGING CONDITION
↓
S501: ACQUIRE WAFER PROCESSING RECIPE
↓
S502: SPECIFY FILM KIND, CUT WIDTH
↓
S503: SELECT IMAGE PROCESSING RECIPE
↓
S504: SET IMAGE PROCESSING RECIPE
↓
END

FIG. 24

| LOT ID | WAFER ID | FILM KIND | CUT WIDTH | IMAGE PROCESSING RECIPE | DATE | TIME | Max | Min | Ave | IMAGE LINK | SETTING INFORMATION LINK |
|---|---|---|---|---|---|---|---|---|---|---|---|
| 3342 | 1 | WATER-SOLUBLE | 3 | RECIPE A | 4/1 | 17:18:12 | 4.12 | 2.99 | 3.54 | cut0401171812.lnk | log0401171812.lnk |
| 3343 | 2 | WATER-SOLUBLE | 3 | RECIPE A | 4/1 | 17:27:34 | 4.11 | 2.98 | 3.54 | cut0401172734.lnk | log0401172734.lnk |
| ... | ... | ... | ... | ... | ... | ... | ... | ... | ... | ... | ... |
| 3841 | 25 | WATER-SOLUBLE | 3 | RECIPE A | 4/1 | 21:45:27 | 4.18 | 2.97 | 3.56 | cut0401214527.lnk | log0401214527.lnk |
| 3842 | 26 | WATER-SOLUBLE | 3 | RECIPE A | 5/1 | 17:08:10 | 4.13 | 2.96 | 3.52 | cut0501170810.lnk | log0501170810.lnk |
| ... | ... | ... | ... | ... | ... | ... | ... | ... | ... | ... | ... |
| 4467 | 1 | WATER-SOLUBLE | 2 | RECIPE B | 5/1 | 20:51:01 | 3.13 | 1.96 | 2.51 | cut0501205101.lnk | log0501205101.lnk |
| ... | ... | ... | ... | ... | ... | ... | ... | ... | ... | ... | ... |
| 5788 | 1 | ALUMINUM | 3 | RECIPE C | 5/12 | 12:45:33 | 4.12 | 2.99 | 3.52 | cut0512134533.lnk | log0512134533.lnk |
| ... | ... | ... | ... | ... | ... | ... | ... | ... | ... | ... | ... |

MANAGEMENT METHOD OF SUBSTRATE PROCESSING APPARATUS AND SUBSTRATE PROCESSING SYSTEM

CROSS-REFERENCE TO RELATED APPLICATION

This application claims the benefit of Japanese Patent Application No. 2016-068212 filed on Mar. 30, 2016, the entire disclosures of which are incorporated herein by reference.

TECHNICAL FIELD

The embodiments described herein pertain generally to a substrate processing apparatus configured to process a substrate such as a semiconductor wafer with a processing liquid.

BACKGROUND

There is known a substrate processing system equipped with a single-sheet type substrate processing apparatus. As one of this kind of system, there is a substrate processing apparatus having a function of removing a film on a peripheral portion of a substrate by supplying a processing liquid onto the peripheral portion of the substrate from a nozzle while holding the substrate having a film formed on a surface thereof and rotating the substrate around a vertical axis. In Patent Document 1, an imaging unit is provided in the substrate processing system, and an image of the peripheral portion of the substrate processed by the substrate processing apparatus is obtained. Based on the image, it is determined whether the film on the peripheral portion of the substrate is appropriately removed.

Patent Document 1: Japanese Patent Laid-open Publication No. 2013-168429

The technique of Patent Document 1, however, merely describes a method of determination on a film removal in a single maintenance operation but does not disclose any management method in operating the substrate processing apparatus for a long term period.

SUMMARY

In view of the foregoing, exemplary embodiments can operate a substrate processing apparatus stably for a long term period by managing information upon a removal of a film on a peripheral portion of a substrate.

In an exemplary embodiment, there is provided a management method of a substrate processing apparatus including a rotating/holding unit configured to hold and rotate a substrate; a processing liquid supply unit configured to supply a processing liquid for removing a film on a peripheral portion of the substrate; and an imaging unit configured to image the peripheral portion of the substrate. Here, the management method of the substrate processing apparatus includes a recipe acquisition process of acquiring a substrate processing recipe including a set value of a cut width of the film; a measurement processing process of measuring the cut width of the film based on an image obtained by imaging, with the imaging unit, the peripheral portion of the substrate which is processed based on the substrate processing recipe; a creation process of creating a management list in which the set value of the cut width of the film, a measurement value of the cut width of the film measured through the measurement processing process and time information at which the measurement result is obtained are correlated; an analysis process of analyzing a state of the processed substrate based on the created management list; and a notification process of making a preset notification to a user based on an analysis result obtained through the analysis process.

According to the exemplary embodiments, it is possible to operate the substrate processing apparatus stably for a long term period by managing the information upon the removal of the film on the peripheral portion of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 12A and FIG. 12B are flowcharts for describing an operation of measuring a cut width and an eccentric amount;

FIG. 21A to FIG. 21H are diagrams for describing an operation of the holding position adjusting device;

FIG. 22A and FIG. 22B are diagrams for describing an image processing recipe;

FIG. 23 is a flowchart for describing an imaging setting processing according to a third exemplary embodiment;

FIG. 24 is a diagram showing an information list of measurement processing results;

DETAILED DESCRIPTION

Figure 1:
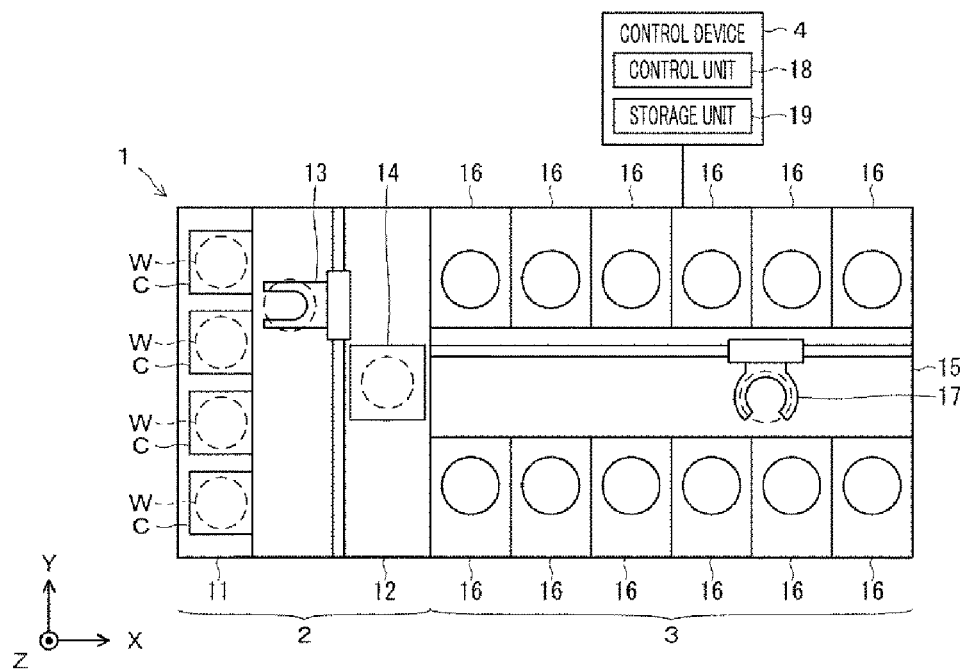
FIG. 1 is a plan view illustrating an outline of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the present exemplary embodiments, a configuration of a substrate processing system, a configuration of a measurement processing system and operations thereof will be mainly described.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Now, a detailed configuration of the processing unit 16 according to the present exemplary embodiment will be explained. The processing unit 16 corresponds to a substrate processing apparatus of the present disclosure. Further, the processing unit 16 is configured to perform a substrate processing of supplying a chemical liquid onto a front surface of a wafer W as a circular substrate on which a semiconductor device is to be formed and removing an unnecessary film formed on a peripheral portion of the wafer W.

Figure 2:
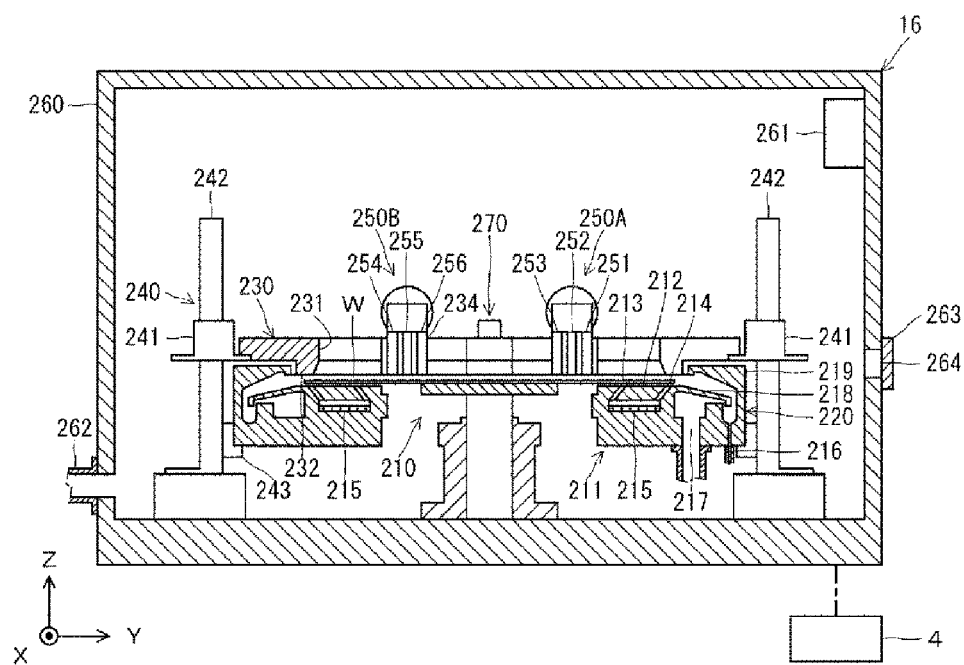
FIG. 2 is a vertical side view of a processing unit according to the exemplary embodiment.
Figure 3:
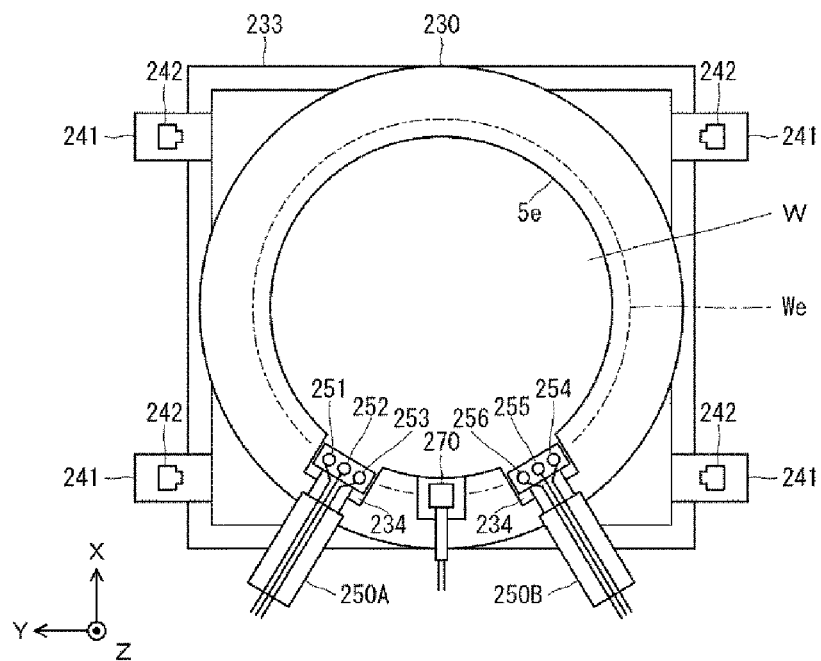
FIG. 3 is a plan view illustrating a cover member of the processing unit, an elevating device therefor and processing liquid supply units.

As shown in FIG. 2 and FIG. 3, the processing unit 16 includes a wafer holding unit 210 configured to hold the wafer W horizontally and allow to be pivotable around a vertical axis; a cup body 220 surrounding the wafer W held by the wafer holding unit 210 and configured to receive a processing liquid dispersed from the wafer W; a ring-shaped cover member 230 configured to cover a peripheral portion of a top surface of the wafer W held by the wafer holding unit 210; an elevating device (moving device) 240 configured to move the cover member 230 up and down; and processing liquid supply units 250A and 250B each configured to supply a processing fluid to the wafer W held by the wafer holding unit 210.

The aforementioned constituent components of the processing unit 16, that is, the cup body 220, the wafer holding unit 210, the cover member 230, and so forth are accommodated in a single housing 260. A clean air inlet unit 261 configured to introduce clean air from the outside is provided at a ceiling portion of the housing 260. Further, an exhaust opening 262 for exhausting an atmosphere within the housing 260 is provided in the vicinity of a bottom surface of the housing 260. Accordingly, a downflow of the clean air flowing from an upper portion of the housing 260 to a lower portion thereof is formed within the housing 260. A carry-in/out opening 264 which is opened or closed by a shutter 263 is provided at one sidewall of the housing 260. A transfer arm of a non-illustrated wafer transfer device provided at an outside of the housing 260 is capable of passing through the carry-in/out opening 264 while holding the wafer W. The wafer holding unit 210 is configured as a circular plate-shaped vacuum chuck, and a top surface of the wafer holding unit 210 is configured as a wafer attraction surface. The wafer holding unit 210 can be rotated at a required speed by a non-illustrated rotational driving device. The wafer holding unit 210 corresponds to a rotating/holding unit of the present disclosure.

As shown in FIG. 2, the cup body 220 is a circular ring-shaped member having a bottom and is provided to surround an outer circumference of the wafer holding unit 210. The cub body 220 serves to receive and collect a chemical liquid scattered from the wafer W after supplied to the wafer W and is configured to drain the received chemical liquid to the outside.

A small gap (for example, having a height of 2 mm to 3 mm) is formed between a bottom surface of the wafer W held by the wafer holding unit 210 and a top surface 212 of an inner circumferential portion 211 of the cup body 220 facing the bottom surface of the wafer W. The top surface 212 facing the wafer W is provided with two gas discharge openings 213 and 214. The two gas discharge openings 213 and 214 are continuously extended along a large-diameter circumference and a small-diameter circumference which are concentric, respectively. The gas discharge openings 213 and 214 discharge a $N_2$ gas (heated $N_2$ gas) toward the bottom surface of the wafer W diagonally upwards and outwards in the radial direction. The $N_2$ gas is supplied into a circular ring-shaped gas diffusion space 215 from a non-illustrated gas inlet line formed within the inner circumferential portion 211 of the cup body 220. Then, the $N_2$ gas is diffused and flown in the circumferential direction while being heated within the gas diffusion space 215 and is discharged from the gas discharge openings 213 and 214.

A drain path 216 and an exhaust path 217 are connected to an outer circumference side of the cup body 220. A ring-shaped guide plate 218 is extended outwards in the radial direction from an outer peripheral portion (a position under a peripheral edge of the wafer W) of the inner circumferential portion 211 of the cup body 220. Further, a circumferential outer wall 219 is provided at the outer circumference side of the cup body 220. The circumferential outer wall 219 receives, with an inner circumferential surface thereof, a fluid (e.g., a liquid droplet, a gas, and a mixture thereof) dispersed outwards from the wafer W and guides the received fluid downwards. The mixed fluid of the gas and the liquid droplet reaching a space under the guide plate 218 are separated, and the liquid droplet is drained through the drain path 216 and the gas is exhausted through the exhaust path 217.

The cover member 230 is a ring-shaped member disposed to face the peripheral portion of the top surface of the wafer W held by the wafer holding unit 210 when a processing is performed. The cover member 230 is configured to rectify a gas flown into the cup body 220 from the vicinity of the peripheral portion of the top surface of the wafer W and configured to increase a flow velocity of the gas, so that the processing liquid scattered from the wafer W is suppressed from re-adhering to the top surface of the wafer W again.

The cover member 230 has an inner circumferential surface 231, and the inner circumferential surface 231 is vertically extended and is inclined outwards in the radial direction as it approaches the wafer W. Further, the cover member 230 has a horizontal bottom surface 232 facing the wafer W, and a minute gap is vertically provided between the horizontal bottom surface 232 and the top surface of the wafer W. An outer periphery of the cover member 230 is located outside a peripheral edge (edge) We of the wafer W in the radial direction (see FIG. 3). Further, the peripheral portion of the wafer W as a cleaning target is a region within about 3 mm from the peripheral edge of the wafer W in the radial direction and covered by the horizontal bottom surface of the cover member 230.

A plan view of FIG. 3 illustrates a state in which the wafer W is held by the wafer holding unit 210 and the cover member 230 is located at a processing position. In FIG. 3, the peripheral edge We of the wafer W hidden from view by being covered with the cover member 230 is indicated by a dashed dotted line. Further, an inner periphery of the cover member 230 is indicated by a reference numeral 5e.

As depicted in FIG. 2 and FIG. 3, the elevating member 240 configured to move the cover member 230 up and down is equipped with a plurality of (in the present exemplary embodiment, four) sliders 241 provided to a supporting body 223 configured to support the cover member 230; and guide columns 242 vertically extended through the respective sliders 241. Each slider 241 is connected with a cylinder motor (not shown). By driving the cylinder motor, each slider 241 is moved up and down along the corresponding guide column 242, so that the cover member 230 can be moved up and down. The cup body 220 is supported by a lifter 243 which constitutes a part of a cup elevating device (not shown). If the lifter 243 is lowered down from a state shown in FIG. 2, the cup body 220 is lowered, and the wafer W can be transferred between the substrate transfer device 17 shown in FIG. 1 and the wafer holding unit 210.

Now, referring to FIG. 2, FIG. 3, FIG. 4A and FIG. 4B, the processing liquid supply units 250A and 250B will be explained. As depicted in FIG. 3, the processing liquid supply unit 250A is equipped with a chemical liquid nozzle 251 configured to discharge a SC-1 solution which is a mixture of ammonia, hydrogen peroxide and pure water; and a rinse nozzle 252 configured to discharge a rinse liquid (in the present exemplary embodiment, DIW (pure water)). Further, the processing liquid supply unit 250A also has a gas nozzle 253 configured to discharge a drying gas (in the present exemplary embodiment, a $N_2$ gas). The processing liquid supply unit 250B is equipped with a chemical liquid nozzle 254 configured to discharge a HF solution; a rinse nozzle 255 configured to discharge a rinse liquid; and a gas nozzle 256 configured to discharge a drying gas.

The processing liquid supply unit 250A corresponds to a first processing liquid supply unit of the present disclosure, and the liquids discharged from the chemical liquid nozzle 251 and the rinse nozzle 252 correspond to a first processing liquid of the present disclosure. Further, the processing liquid supply unit 250B corresponds to a second processing liquid supply unit of the present disclosure, and the liquids discharged from the chemical liquid nozzle 254 and the rinse nozzle 255 correspond to a second processing liquid of the present disclosure. Furthermore, the kinds of the first processing liquid and the second processing liquid are not limited to the aforementioned examples, and the positional relationship of the first processing liquid supply unit and the second processing liquid supply unit can be reversed.

Figure 4A:
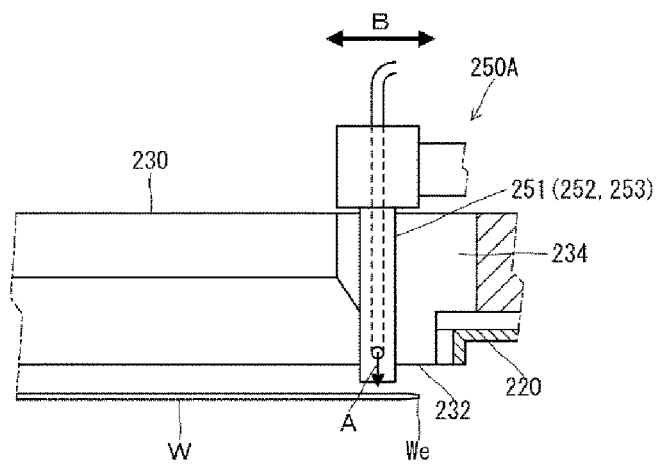
FIG. 4A and FIG. 4B are enlarged cross sectional views illustrating the vicinity of a peripheral edge of a wafer on the right side of FIG. 2 in detail.
Figure 4B:
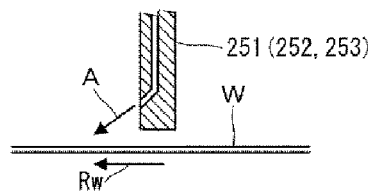

As shown in FIG. 3 and FIG. 4A, the nozzles 251 to 253 of the processing liquid supply unit 250A are accommodated in a recess 234 formed in the inner circumferential surface of the cover member 230. Each of the nozzles 251 to 253 discharges the processing fluid diagonally downwards, as indicated by an arrow A in FIG. 4B, such that the discharging direction indicated by the arrow A has a component of a rotational direction Rw of the wafer W. Further, the processing liquid supply unit 250A includes a non-illustrated driving device, and each of the nozzles 251 and 253 is configured to be position-adjustable by being moved forward and backward in a direction of an arrow B such that the liquid can be supplied to an optimum position on the wafer W when the liquid is discharged. The processing liquid supply unit 250B has the same configuration as the processing liquid supply unit 250A.

The control device 4 shown in FIG. 2 controls operations of all functional components of the processing unit 16 (e.g., the non-illustrating rotational driving device, the elevating device 240, the wafer holding unit 210, the various processing fluid supply devices, etc.).

An imaging device 270 corresponds to an imaging unit of the present disclosure and is configured to perform a measurement processing upon the wafer W to be described later. The imaging device 270 is fixed to the cover member 230 and is disposed such that an opening for performing the imaging is located vertically above the peripheral portion of the wafer W (in the Z-axis direction).

A configuration of the imaging device 270 according to the exemplary embodiment will be explained with reference to a cross sectional view of FIG. 5. The imaging device 270 includes an imaging functional unit 501 and an optical guide unit 502. The imaging functional unit 501 is configured to image the wafer W through the optical guide unit 502. The optical guide unit 502 is configured to guide illumination light to the surface of the wafer W and guide reflection light (hereinafter, referred to as optical image) to the illumination light on the wafer W to the imaging functional unit 501. The optical guide unit 502 is mounted to a side surface of the cover member 230 with a mounting surface AA therebetween. Though the cover member 230 has a cross sectional shape shown in FIG. 2, a circumferential region of the cover member 230 corresponding to the mounting surface AA of the optical guide unit 502 is notched. However, it should be noted that the entire cross sectional shape combining the cover member 230 and the optical guide unit 502 conforms to the contour of the cross sectional shape of the cover member 230 shown in FIG. 2.

The imaging functional unit 501 is equipped with an imaging sensor 503. In the present exemplary embodiment, the imaging sensor 503 is implemented by a CCD sensor having an effective pixel region of about 2 million pixels composed of 1600 pixels and 1200 lines. This imaging sensor 503 only generates a signal corresponding to a luminance signal according to a light reception level. An imaging optical mechanism 504 having at least a focus adjustment function is provided in front of (ahead of) the imaging sensor 503. The imaging optical mechanism 504 includes a lens group and is configured to change positions of lenses for the focus adjustment. In the present exemplary embodiment, there is provided an adjusting member 505 with which a user can adjust the focus by adjusting a lens position manually. Since the adjusting member 505 is provided at a position higher than the cover member 230 and the imaging functional unit 501, the user of the apparatus can easily operate it manually.

A mirror 506 is provided in front of the imaging optical mechanism 504 in an optical axis direction. Since the imaging device 270 is provided with the opening which is opened toward the vertically upward direction of the wafer W (in the Z-axis direction), the optical image of the surface of the wafer W as the imaging target is oriented in a vertically upward direction LZ. The mirror 506 converts the direction of the optical image to a horizontal direction LX and allows the direction of the optical image to be coincident with the optical axis of the imaging sensor 503 and the imaging optical mechanism 504.

An illumination room 507 is for generating therein irradiation light to the wafer W and includes therein a LED illumination unit 508 and a mirror 509. The LED illumination unit 508 is configured to generate the irradiation light for irradiating the wafer W. The mirror 509 reflects the irradiation light from the LED illumination unit 508 vertically downwards and transmits the optical image in the LZ direction. The opening 510 has a rectangular cross sectional shape and is configured to guide the irradiation light reflected from the mirror 509 of the illumination room 507 downwards. The cross section of the opening 510 may have a circular shape, alternatively.

A glass window 511 has the same cross sectional shape as the opening 510 at an upper end thereof and serves to guide the irradiation light incident from the opening 510 to the surface of the wafer W as the imaging target. Further, the glass window 511 also guides the reflection light form the surface of the wafer W in the LZ direction as the optical image. A bottom surface 512 of the glass window 511 is a lower end of the imaging device 270 and has a flat surface facing the peripheral portion of the top surface of the wafer W, and this flat surface is set to be the same height as the bottom surface 232 of the cover member 230 of FIG. 2. Further, in order to conform to the shape of the cover member 230, an outer side surface 513 of the glass window 511 is recessed at a height of an outer bottom surface of the cover member 230 as compared to an upper portion thereof. Accordingly, in an overall view, the glass window 511 is formed to have an L-shaped cross section.

While the processing liquid supply unit 250A (250B) is supplying the chemical liquid or the rinse liquid to the wafer W, an atmosphere containing the chemical liquid or moisture passes through a region below the opening 510 of the imaging device 270. The glass window 511 has a function of blocking this atmosphere from entering the opening 510 in order to suppress this atmosphere from entering the inside of the housing of the imaging device 270 and rusting the internal structure. Since the glass window 511 is a transparent member, it blocks the atmosphere but transmits the irradiation light or the reflection light from the surface of the wafer W.

An inner cover member 514 is provided to suppress the glass window 511 from being covered with the liquid, and has the same shape as the inner circumferential surface 231 of the cover member 230 shown in FIG. 2. As stated, by forming the same contour as the cross section of the cover member 230 with the bottom surface 512 and the outer side surface 513 of the glass window 511 and the inner cover member 514, an air flow which flows into the cup body 220 from the cover member 230 can be suppressed from being disturbed due to the shape of the imaging device 270.

An imaging controller 515 of the imaging functional unit 501 controls an imaging operation of the imaging device 270 and performs an image processing upon the image. The optical image received by the imaging sensor 503 is photoelectrically converted and then converted to an analog signal corresponding to the luminance signal. Then, this analog signal is sent to the imaging controller 515. The imaging controller 515 generates a digital signal indicating the luminance by performing A/D conversion of the received analog signal, and forms a 1-frame image by performing a preset image processing. Further, the imaging controller 515 may generate a moving image by acquiring still image frames continually. Through a cable 516, a control signal can be transmitted to/from an external device, and transmits the image to the external device.

Figure 6:
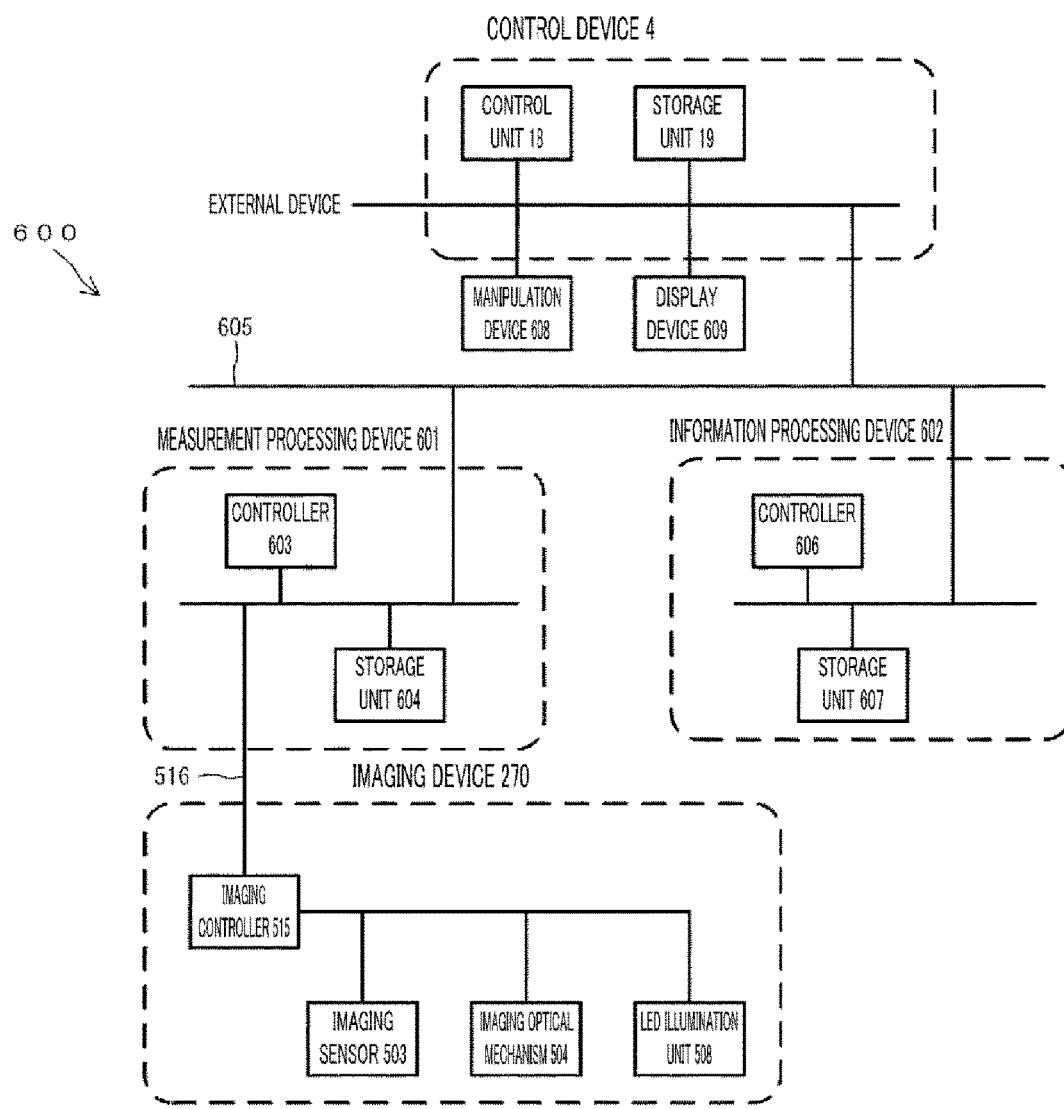
FIG. 6 is a diagram illustrating a schematic configuration of a measurement processing system according to the exemplary embodiment.

A measurement processing system 600 according to the exemplary embodiment will be discussed with reference to FIG. 6. The present system includes the imaging device 270, a measurement processing device 601, an information processing device 602 and the control device 4.

The imaging device 270 includes, as described above with reference to FIG. 5, the imaging sensor 503, the imaging optical mechanism 504, the LED illumination unit 508, the imaging controller 515, the cable 516, and so forth. As will be described later, the imaging controller 515 may perform the imaging under modified imaging conditions based on the control signal transmitted from the measurement processing device 601 through the cable 516.

The measurement processing device 601 is configured to measure a cut width and an eccentric amount to be described later by processing the image obtained by the imaging device 270. The measurement processing device 601 may have at least a controller 603 and a storage unit 604 within a housing thereof.

The controller 603 controls blocks of the measurement processing device 601, and also controls the operation of the imaging device 270. Further, by executing a measurement processing program to be described later, the controller 603 performs calculation regarding the cut width or the eccentric amount. The storage unit 604 stores therein the measurement processing program performed by the controller 603 and an image processing recipe to be described later. Furthermore, the storage unit 604 temporarily stores the image received from the imaging device 270 through the cable 516, and also stores the measurement result calculated by the controller 603. The measurement processing device 601 is capable of sending/receiving various kinds of information to/from the information processing device 602 and the control device 4 through a communication line 605.

The information processing device 602 is configured to accumulate the image and the measurement result sent from the measurement processing device 601 and transmits these information to the control device 4. The information processing device 602 includes at least a controller 606 and a storage unit 607 within a housing thereof. The controller 606 controls blocks of the information processing device 602 and is capable of sending various kinds of instructions to the measurement processing device 601. Furthermore, the controller 606 also has a function of analyzing the measurement result. The storage unit 607 accumulates therein the image and the measurement result sent from the measurement processing device 601. The information processing device 602 is capable of sending/receiving various kinds of information to/from the measurement processing device 601 and the control device 4 through the communication line 605.

The control device 4 controls an overall operation of the substrate processing system 1, as shown in FIG. 1, and can be operated in cooperation with the measurement processing device 601 and the information processing device 602. The control device 4 is capable of sending/receiving various kinds of information to/from the measurement processing device 601 and the information processing device 602 through the communication line 605. Furthermore, the control device 4 is connected to a manipulation device 608 and a display device 609. The display device 609 is configured to display the image and the processed image received from the information processing device 602. The manipulation device 608 includes an input device such as, but not limited to, a keyboard, a mouse, or a touch panel, and is capable of selecting a wafer processing recipe in which a processing to be performed on the wafer W as a measurement target is described.

In the present exemplary embodiment, the individual devices constituting the measurement processing system 600 are accommodated in a housing of the substrate processing system 1. However, the exemplary embodiment is not limited thereto, and a single device or a plurality of devices may be accommodated in a separate housing, and the communication line 605 may be implemented by a wired or wireless network. As an example, the information processing device 602 may be accommodated in another housing to be separate from the substrate processing system 1, and the substrate processing system 1 may be remote-controlled.

Now, an overall flow of a substrate processing and a measurement processing performed by the substrate processing system 1 and the measurement processing system 600 according to the exemplary embodiment will be discussed with reference to FIG. 7. This processing operation is performed for every single set of 25 sheets of wafers W, and the flowchart of FIG. 7 describes the processing operation for a single sheet of wafer W within a single set.

First, the wafer W is carried into the processing unit 16 (S101). Here, the cover member 230 is placed at a retreat position (a position above that shown in FIG. 2) by the elevating device 240, and the cup body 220 is lowered by the lifter 243 of the cup elevating device. Then, the shutter 263 of the housing 260 is opened, and a transfer arm of the substrate transfer device 17 shown in FIG. 1 is advanced into the housing 260, and the wafer W held by the transfer arm of the substrate transfer device 17 is placed directly above the wafer holding unit 210. Thereafter, the transfer arm is lowered to a position lower than the top surface of the wafer holding unit 210, and the wafer W is positioned on the top surface of the wafer holding unit 210. Then, the wafer W is attracted to and held by the wafer holding unit 210. Afterwards, the empty substrate transfer device 17 is retreated out of the housing 260. Subsequently, the cup body 220 is moved up and returned back to the position shown in FIG. 2, and the cover member 230 is lowered to the processing position shown in FIG. 2. Through this sequence, the carry-in of the wafer W is completed, and a state shown in FIG. 2 is obtained.

Then, a wafer processing is performed with the chemical liquid or the like (S102). Details of the wafer processing according to the present exemplary embodiment will be elaborated later.

Subsequently, a measurement processing upon the wafer W is performed (S103). Details of the measurement processing according to the present exemplary embodiment will be elaborated later.

Finally, a carry-out of the wafer W from the processing unit 16 is performed (S104). Here, the cover member 230 is raised to the retreat position, and the cup body 220 is lowered. Then, the shutter 263 of the housing 260 is opened, and the empty transfer arm of the substrate transfer device 17 is advanced into the housing 260. The empty transfer arm is positioned under the wafer W held by the wafer holding unit 210 and is then raised. Accordingly, the transfer arm receives the wafer W from the wafer holding unit 210 which stops the attraction of the wafer W. Thereafter, the transfer arm holding the wafer W is retreated from the housing 260. Through these operations, the series of liquid processings upon the single sheet of wafer W is ended.

Figure 8:
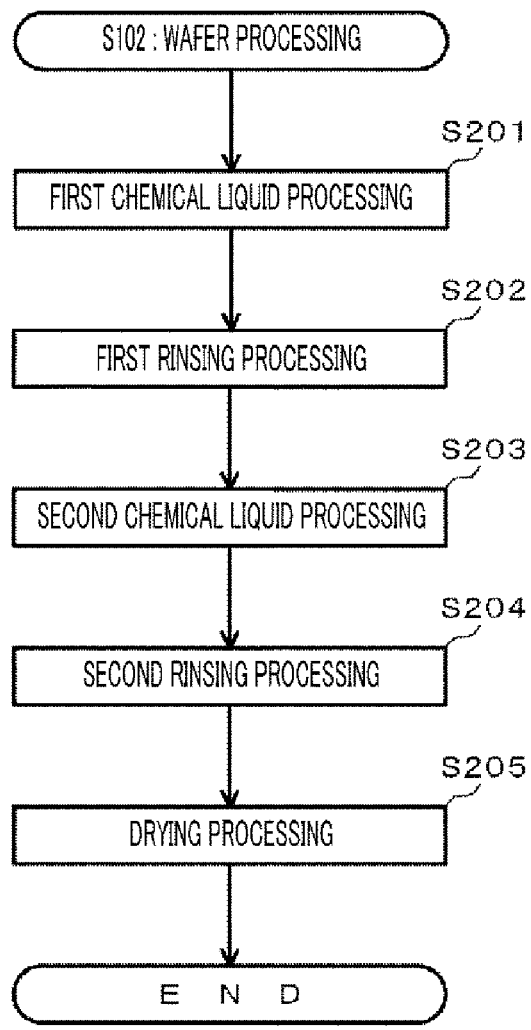
FIG. 8 is a diagram for specifically describing a chemical liquid processing of the overall flow according to the first exemplary embodiment.

Now, the wafer processing performed in the process S102 according to the present exemplary embodiment will be elaborated with reference to a flowchart of FIG. 8.

First, a first chemical liquid processing is performed (S201). Here, while rotating the wafer W and discharging the N$_2$ gas from the gas discharge openings 213 and 214 of the cup body 220, the wafer W, particularly, the peripheral portion of the wafer W as a processing target region is heated up to a temperature (e.g., about 60° C.) suitable for the chemical liquid processing. If the wafer W is heated sufficiently, the chemical liquid SC-1 is supplied to the peripheral portion of the top surface (device forming surface) of the wafer W from the chemical liquid nozzle 251 of the processing liquid supply unit 250A while the wafer W is being rotated, so that an unnecessary film on the peripheral portion of the top surface of the wafer W is removed.

Then, a first rinsing processing is performed (S202). Here, after the chemical liquid processing is performed for a preset time period, the discharge of the chemical liquid from the chemical liquid nozzle 251 is stopped, and a rinsing processing is performed by supplying a rinse liquid (DIW) to the peripheral portion of the wafer W from the rinse nozzle 252 of the processing liquid supply unit 250A. Through this rinsing processing, the chemical liquid and a reaction product remaining on the top surface and the bottom surface of the wafer W are washed away. Here, a drying processing which is the same as a process S205 to be described later may also be performed.

Thereafter, a second chemical liquid processing is performed (S203). Here, a chemical liquid processing is performed on the wafer W to remove an unnecessary material that cannot be removed in the first chemical liquid processing. As in the first chemical liquid processing, while rotating and heating the wafer W, the chemical liquid HF is supplied to the peripheral portion of the top surface (device forming surface) of the wafer W from the chemical liquid nozzle 254 of the processing liquid supply unit 250B, so that an unnecessary film on the peripheral portion of the top surface of the wafer W is removed.

Then, a second rinsing processing is performed (S204). Here, after the chemical liquid processing is performed for a preset time period, the discharge of the chemical liquid from the chemical liquid nozzle 254 is stopped while continuously rotating the wafer W and discharging the N$_2$ gas from the gas discharge openings 213 and 214. Then, the rinse liquid (DIW) is supplied to the peripheral portion of the wafer W from the rinse nozzle 255 of the processing liquid supply unit 250B, so that the rinsing processing is performed. Through this rinsing processing, the chemical liquid and a reaction product remaining on the top and bottom surfaces of the wafer W can be washed away.

Finally, a drying processing is performed (S205). After the rinsing processing is performed for a predetermined time period, the discharge of the rinse liquid from the rinse nozzle 255 is stopped while continuously rotating the wafer W and discharging the N$_2$ gas from the gas discharge openings 213 and 214. Then, the drying gas (N$_2$ gas) is supplied to the peripheral portion of the wafer W from the gas nozzle 256, so that the drying processing is performed.

Now, referring to FIG. 9A and FIG. 9B, a relationship between a liquid state on the wafer W and a placement of the imaging device 270 in the chemical liquid processing of the process S102 will be explained.

First, the first chemical liquid processing of discharging a first chemical liquid (SC-1 solution) toward the wafer W in the process S201 will be discussed.

Figure 9A:
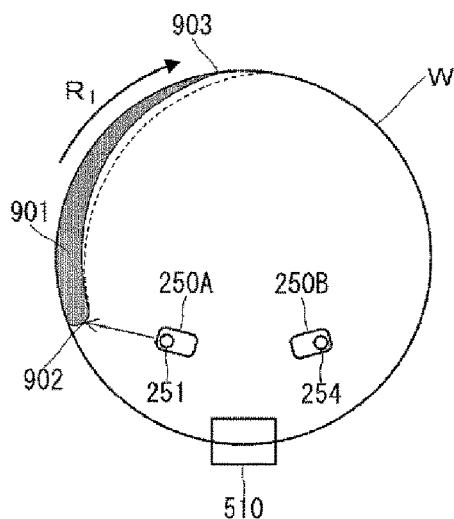
FIG. 9A and FIG. 9B are diagrams for describing a relationship between a placement of the imaging device and a liquid state on the wafer W in the chemical liquid processing according to the present exemplary embodiment.

As depicted in FIG. 9A, the wafer W is rotated in a first rotational direction R$_1$. A rotation number is set to be, for example, 2000 rpm to 3000 rpm, and the first chemical liquid is supplied onto the peripheral portion of the top surface of the wafer W from the chemical liquid nozzle 251. In FIG. 9A, the first chemical liquid existing (loaded) on the top surface of the wafer W is indicated by a reference numeral 901. As illustrated, the first chemical liquid supplied onto an arrival region 902 of the peripheral portion of the wafer W being rotated in the first rotational direction R$_1$ is moved to an outer side of the wafer W by a centrifugal force due to the rotation, and is scattered outwards from the wafer W. The first chemical liquid scattered outwards from the wafer W is drained to the outside through the drain path 216 via the inner circumferential surface of the circumferential outer wall 219 of the cup body 220.

A position 903 on the wafer W at which the first chemical liquid is completely scattered off the wafer W depends on parameters such as a velocity of the first chemical liquid discharged from the chemical liquid nozzle 251, a rotational speed of the wafer W and a distance from the aforementioned first chemical liquid arrival region 902 to a side end portion of the wafer W. For example, if the rotation number is reduced, the chemical liquid becomes difficult to scatter by the centrifugal force, so that a region where the chemical liquid exists is increased, as indicated by a dotted line.

The same goes for the rinse nozzle 252 and the rinse liquid reaching the wafer W after being discharged in the process S202. Though an arrival region of the rinse liquid from the rinse nozzle 252 is substantially the same as the arrival region 902 of the first chemical liquid, it is slightly moved to the front position in the rotational direction and to the center side of the wafer W, as compared to the arrival region of the first chemical liquid. Therefore, the region where the first chemical liquid has flown on the top surface of the wafer W can be securely cleaned by the rinse liquid.

Now, a second chemical liquid processing of discharging the second chemical liquid HF toward the wafer W in the process S203 will be explained.

Figure 9B:
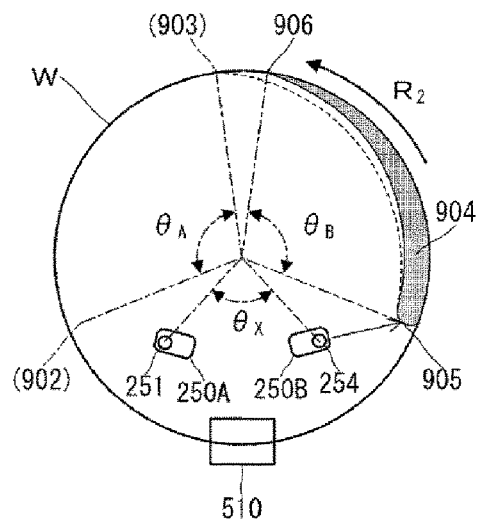

As depicted in FIG. 9B, the wafer W is rotated in a second rotational direction $R_2$ which is opposite to the first rotational direction $R_1$. A rotation number is set to be, for example, 2000 rpm to 3000 rpm, and the second chemical liquid is supplied onto the peripheral portion of the top surface of the wafer W from the chemical liquid nozzle 254. As illustrated, the second chemical liquid existing (loaded) on the top surface of the wafer W is indicated by a reference numeral 904. The second chemical liquid supplied onto an arrival region 905 shows the same behavior as the first chemical liquid in the process S201. Then, in the process S204, the rinse nozzle 255 and the rinse liquid reaching the wafer W after being discharged are the same as described in the case of the rinse nozzle 252.

As stated above, by rotating the wafer W in the reverse directions in the processes S201 and S202 and in the processes S203 and S204, the regions of the first chemical liquid 901 and the second chemical liquid 904 on the top surface of the wafer W and the positions 903 and 906 where the chemical liquids are completely scattered off the wafer W can be adjusted. Here, an angle formed by connecting the processing liquid supply unit 250A and the processing liquid supply unit 250B with the center of the wafer W is defined as "Ox" degree; an angle formed by connecting the arrival region 902 and the region 903 with the center of the wafer W, "$\theta_A$" degree; and an angle formed by connecting the arrival region 905 and the region 906 with the center of the wafer W, "$\theta_B$" degree (see FIG. 9B). At this time, these angles need to satisfy a relational expression of $\theta_X+\theta_A+\theta_B<360°$. For example, when $\theta_X=60°$, by setting $\theta_A<120°$ and $\theta_B<120°$, this condition can be satisfied, and the positions 903 and 906 where the chemical liquids are completely scattered off do not intersect on the circumference. Accordingly, it is possible to suppress generation of salt that might be caused as the processing liquids scattered from the wafer W are mixed and react with each other within the cup body 220.

Further, with respect to the first rotational direction $R_1$, the opening 510 is located in front of the arrival region 902 of the first chemical liquid and the rinse liquid on the wafer W, and with respect to the second rotational direction $R_2$, the opening 510 is located in front of the arrival region 905 of the second chemical liquid and the rinse liquid on the wafer W. By locating the opening 510 of the imaging device 270 in this way, it is possible to suppress the opening 510 from being covered with the liquid when the chemical liquid processing is being performed.

Figure 10:
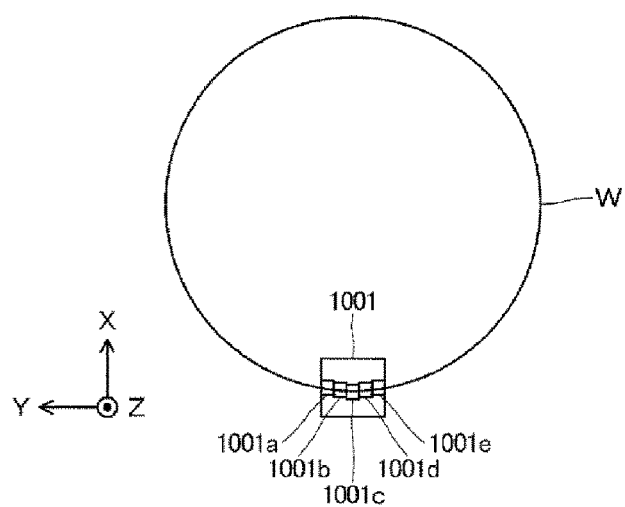
FIG. 10 is a diagram illustrating an angle of view of the imaging device with respect to the wafer W.

FIG. 10 is a diagram illustrating an angle of view of the imaging device 270 with respect to the wafer W. As depicted in FIG. 10, the imaging device 270 sets a rectangular region located at the periphery of the wafer W as the angle of view 1001.

The measurement processing device 601 uses images cut from the entire image of the angle of view 1001 to measure the cut width and the eccentric amount. To elaborate, in the angle of view 1001 of the imaging device 270, cut images of five regions 1001a, 1001b, 1001c, 1001d and 1001e whose positions are adjusted along the edge of the wafer W are used. Each cut image has a size of, for example, 320 pixels in the X-axis direction×240 pixels in the Y-axis direction. Further, in the present exemplary embodiment, two images are acquired for each angle of view 1001 under a first imaging condition and a second imaging condition, respectively, as will be described later.

Figure 11:
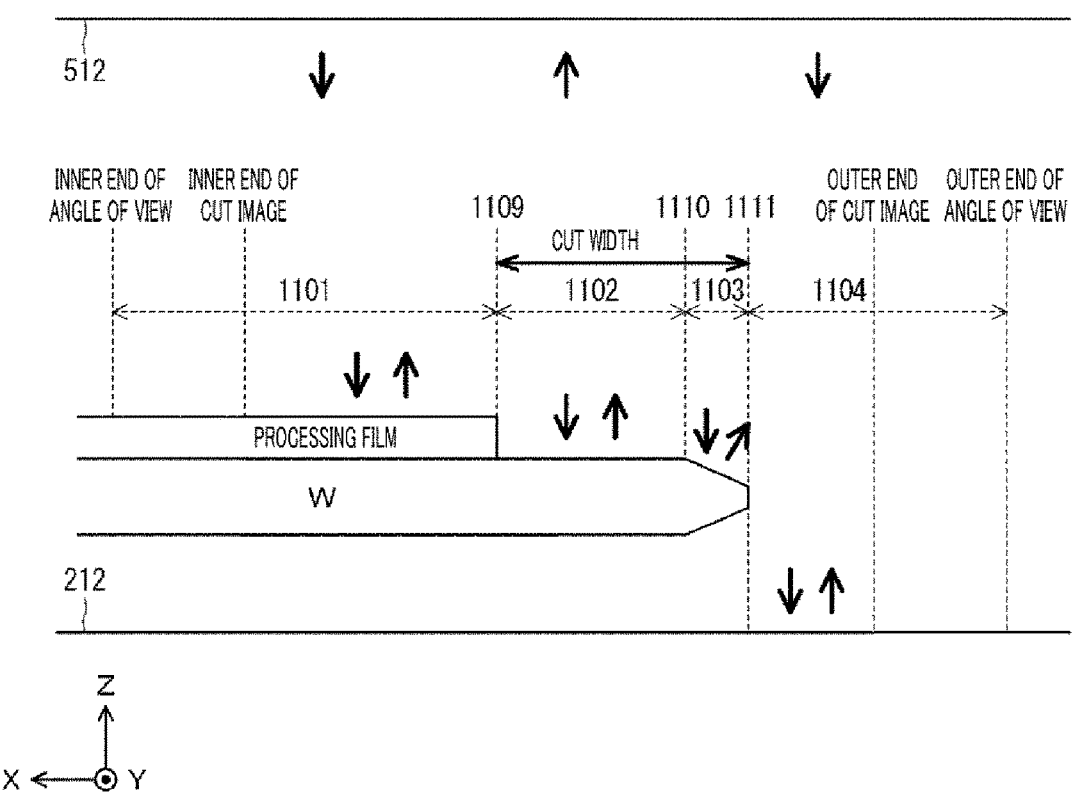
FIG. 11 is a diagram illustrating an arrangement relationship of the imaging device, the processing unit and the wafer W.

Referring to FIG. 11, an arrangement relationship of the imaging device 270, the processing unit 16 and the wafer W will be explained. As shown in the figure, the wafer W has a round at the peripheral portion thereof. A processing film is formed on the top surface of the wafer W and only the processing film on the peripheral portion thereof is removed (cut). Further, the wafer W has a diameter of 300 mm and has no error in the circumferential direction thereof.

In case that the imaging device 270 is appropriately provided, an inner end (upper end) of the angle of view of the imaging device 270 in the longitudinal (X-axis) direction is located above the processing film of the wafer W, and an outer end (lower end) thereof is located above the top surface 212 of the inner circumferential portion 211 shown in FIG. 2. Thus, on the image obtained by the imaging device 270, a processing film region 1101, a cut surface region 1102, a round region 1103 and a top surface region 1104 is arranged in sequence from the inner end (upper end) of the angle of view. Here, the processing film region 1101 is a region where the formed processing film remains without being removed by the chemical liquid. In a region where the formed processing film is removed, the cut surface region 1102 is a flat surface region not including the round which is formed at the circumferential edge of the wafer W. The round region 1103 is a rounded area from which the processing film is removed or at which no processing film is originally formed. The top surface region 1104 is a region formed ahead of the circumferential edge of the wafer W.

Further, the cut width refers to a width of a region, where no processing film exits (a region from which the processing film is removed or at which no processing film is originally formed), which is composed of the cut surface region 1102 and the round region 1103 between the circumferential edge of the processing film and the circumferential edge of the wafer W at the circumferential edge of the wafer W. Further, a width of the cut surface region 1102 is referred to as a cut surface width, and a width of the round region 1103 is referred to as a round width.

Now, an operation of measuring the cut width and the eccentric amount in the process S103 performed by the cooperation of the individual devices of the present exemplary embodiment will be explained with reference to flowcharts of FIG. 12A and FIG. 12B. The measuring operation shown in this flowchart is implemented as the controller 603 of the measurement processing device 601 executes the measurement processing program stored in the storage unit 604.

When the overall flow transits to the process S103, the arrangement relationship of the imaging device 270, the processing unit 16 and the wafer W is already in the state shown in FIG. 11.

First, the measurement processing device 601 sets the first imaging condition and the second imaging condition to be described below as an imaging condition under which the imaging device 270 performs the imaging operation (process S301). At this time, the wafer W is located at a preset initial rotation position.

Then, the imaging of the wafer W is performed under the first imaging condition (process S302). Here, the controller 603 of the measurement processing device 601 sends a control instruction to the imaging device 270 to allow the imaging operation to be performed under the first imaging condition. In response to the control instruction, the imaging controller 515 controls the imaging sensor 503 and the LED illumination unit 508 to perform the imaging operation under the first imaging condition according to the received control instruction. The imaging controller 515 converts a signal obtained by the imaging of the imaging sensor 503 into an image of a luminance signal of a single frame, and sends this image to the measurement processing device 601. The image sent to the measurement processing device 601 is stored in the storage unit 604. Here, details of the first imaging condition and the actual image state will be described later.

After the imaging operation under the first imaging condition, the imaging of the wafer W is performed under the second imaging condition (process S303). This operation is the same as the process S302. Details of the second imaging condition and the actual image state will be explained later.

Subsequently, it is determined whether the imaging is conducted at all of preset positions (S304). In the present exemplary embodiment, since the imaging is performed 360 times while rotating the wafer W by 1 degree from the position where the imaging is performed in the processes S302 and S303, the determination of "Yes" is only made after the imaging is performed at 360 positions.

Here, since the imaging is performed only at the initially set position in the process S301 (process S304: No), the processing proceeds to a rotating operation of a process S305.

The control device 4 drives a rotational driving unit to rotate the wafer W by 1 degree by rotating the wafer holding unit 210. As a result, a next imaging position is allowed to be located directly under the imaging device 270 (S305).

If the rotating operation is finished, the processing returns back to the process S302, and the same imaging operation and rotating operation as stated above are performed. If these operations are performed 360 times, it is determined that the imaging is conducted at all positions (process S304: Yes), and the processing proceeds to a process S306 where an image analysis processing is conducted by using 360 sets of first and second images (S306). Then, as a measurement result, the cut width and the eccentric amount are obtained (S307). Details of the image analysis processing will be described later.

In the present exemplary embodiment, the controller 603 sends, to the information processing device 602, the first image obtained under the first imaging condition, the second image obtained under the second imaging condition, and the cut width (S308). The information processing device 602 stores the received first and second images in the storage unit 607.

Subsequently, details of the imaging operation and the image analysis processing in the processes S302 to S306 will be elaborated.

Information measured in the present exemplary embodiment is the cut width of the wafer W. With reference to the relationship shown in FIG. 11, this value can be calculated by the following expressions (1) to (3).

Cut width (mm)=width (mm) of cut surface region 1102+width (mm) of round region 1103    Expression (1)

Here,

Width (mm) of cut surface region 1102=(position (pixel) of cut surface boundary 1110−position (pixel) of processing film boundary 1109)/scaling value (pixel/mm)    Expression (2)

Width (mm) of round region 1103=(position (pixel) of wafer circumferential edge 1111−position (pixel) of cut surface boundary 1110)/scaling value (pixel/mm)    Expression (3)

In the above expressions (1) to (3), the term "position (pixel)" refers to a count value of pixels from the inner end of the cut image in the transversal direction. In the present exemplary embodiment, since the number of pixels in the transversal direction (X-axis direction) of the cut image is 320, the "position (pixel)" may have a value ranging from 1 to 320.

Here, it is assumed that a corresponding relation between the number of pixels of the image obtained by the camera and a length (mm) of a plane on which the wafer W is placed is previously measured and determined by using a scaling wafer or the like. In the present exemplary embodiment, the value of "scaling value"=20 pixels/mm is stored in the storage unit 604.

In the present exemplary embodiment, as depicted in FIG. 10, five regions are extracted from the single image, and the cut width of each of these regions is calculated. Then, an average value of these cut widths is set as a final cut width in each region.

As can be seen from the expressions (1) to (3), in order to calculate the cut width, the three boundary positions of (a) the position of the cut surface boundary 1110, (b) the position of the processing film boundary 1109 and (c) the position of the wafer circumferential edge 1111 need to be specified from a variation amount (luminance edge amount) in a luminance level of pixels of the image. Here, the luminance edge amount can be obtained by using a method of calculating a peak value from an absolute value of a difference in the luminance values between adjacent pixels or a method of applying a commonly known edge filter to the image.

The respective regions 1101 to 1104 of the wafer W and the processing unit 16 of the present exemplary embodiment have their own reflection characteristics caused by the materials or structures thereof. In case that irradiation light having the same illumination level which is generated from the LED illumination unit 508 is incident, the cut surface region 1102 may exhibit a higher reflection light level (bright gray) than a reflection light level (gray) of the processing film region 1101 due to a difference in their materials, for example. Meanwhile, though the cut surface region 1102 and the round region 1103 are made of the same material, since the round region 1103 is inclined, a reflection light level of the round region 1103 in the direction of the imaging sensor 503 is low (close to black).

As for the top surface region 1104, though attenuation of light occurs because a reflection surface thereof is relatively far, the top surface region 1104 still exhibits a certain reflection light level (gray close to black).

Resultantly, the illumination level of the optical image received by the imaging sensor 503 is higher in the order of the cut surface region 1102, the processing film region 1101, the top surface region 1104 and the round region 1103.

As stated above, according to the exemplary embodiment, in case of using the illumination light having the same illumination level from the LED illumination unit 508, the range of the illumination level in the optical image is very large. Thus, with the imaging sensor 503 having a dynamic range of a typical width, it may not be possible to perform the imaging such that the illumination levels of all the regions have appropriate luminance levels. Since the accurate luminance edge cannot be calculated from the image which does not have an appropriate luminance level, there may be caused an error in specifying the three boundary positions (a) to (c).

According to the present exemplary embodiment, the first imaging condition and the second imaging condition which are different in brightness conditions are previously prepared. Then, by performing the imaging two times under these first and second imaging conditions, the aforementioned problem can be solved. For the convenience of explanation, the second imaging condition and a second image will be first explained.

For the second imaging condition, a condition in which an emphasis is put on an intermediate illumination level is set to acquire a relatively bright image and accurately specify (b) the position of the processing film boundary 1109. That is, it is set such that the illumination level of the processing film region 1101 and the illumination level of the cut surface region 1102 in the optical image has a wide width of gradation when the illumination level of the optical image is converted to the luminance signal. Specifically, this can be adjusted by setting a sensitivity of CCD (e.g., ISO sensitivity) or a light receiving time of CCD with a non-illustrated exposure adjusting device, for example.

Here, since the second imaging condition puts the emphasis on the intermediate illumination level, reproducibility of a region of a low illumination level is low. That is, since the gradation of the illumination levels of the top surface region 1104 and the round region 1103 is narrowed, each region is turned out to be an image having a color close to black.

Figure 13:
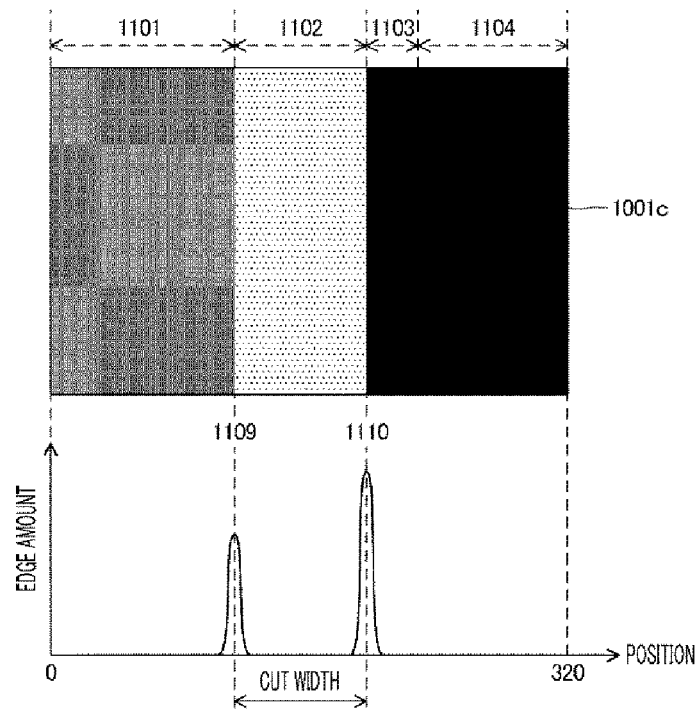
FIG. 13 is a schematic diagram of a second image obtained under a second imaging condition.

A schematic view of the second image obtained under the second imaging condition is illustrated in FIG. 13. Since the gradation of the luminance signal levels of the processing film region 1101 and the cut surface region 1102 is sufficiently maintained, the variation in the luminance levels of the pixels of these two regions, that is, the luminance edge can be easily detected, and (b) the position of the processing film boundary 1109 can be accurately specified. Furthermore, (a) the position of the cut surface boundary 1110 can also be specified accurately. Meanwhile, the top surface region 1104 and the round region 1103 are all located at low luminance signal values (nearly black). For this reason, the detection of the luminance edge is difficult, and (c) the position of the wafer circumferential edge 1111 cannot be specified.

In the present exemplary embodiment, (c) the position of the wafer circumferential edge 1111 is specified from a first image which is relatively dark and is obtained under the first imaging condition, i.e., the other imaging condition.

The first imaging condition is set as a condition in which an emphasis is put on a low illumination level. That is, it is set such that the illumination level of the round region 1103 has a wide width of gradation when the illumination level of the optical image is converted to the luminance signal. To elaborate, this may be adjusted by setting a sensitivity of CCD (e.g., ISO sensitivity) to be higher than that of the second imaging condition or by setting the light receiving time of CCD to be longer than that of the second imaging condition.

Here, since the first imaging condition puts the emphasis on the low illumination level, reproducibility of a region of the intermediate illumination level is low. That is, since the gradation of the illumination levels of the processing film region 1101 and the cut surface region 1102 is narrowed, each region is turned out to be an image having a color close to white.

Figure 14:
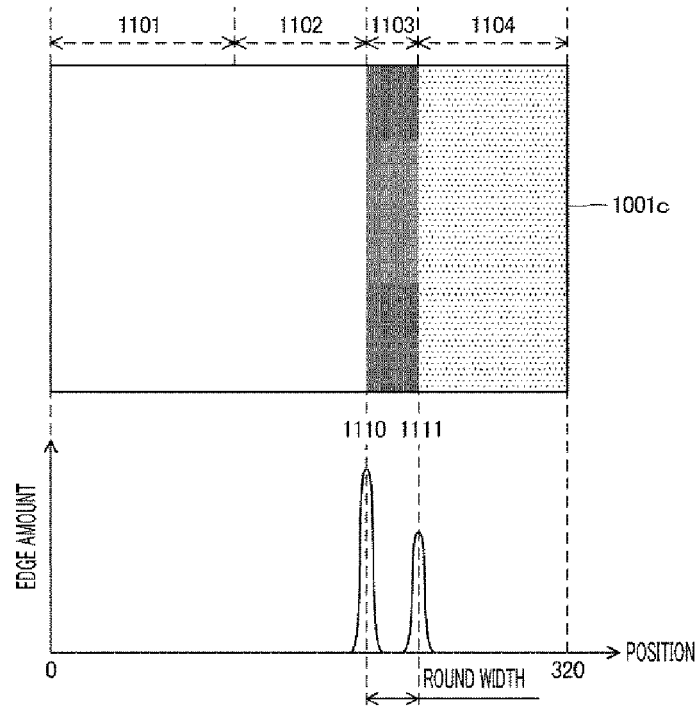
FIG. 14 is a schematic diagram of a first image obtained under a first imaging condition.

A schematic view of the first image obtained under the first imaging condition is illustrated in FIG. 14. Since the gradation of the luminance signal values of the top surface region 1104 and the round region 1103 are sufficiently maintained, the luminance edge can be easily detected, so that (c) the position of the wafer circumferential edge 1111 can be accurately specified. Meanwhile, the processing film region 1101 and the cut surface region 1102 are all located at high luminance signal values (nearly white). For this reason, the detection of the luminance edge is difficult, and (b) the position of the processing film boundary 1109 cannot be specified.

As stated above, by using the first image based on the first imaging condition and the second image based on the second imaging condition, (a) the position of the cut surface boundary 1110, (b) the position of the processing film boundary 1109 and (c) the position of the wafer circumferential edge 1111 can be accurately obtained.

The controller 603 calculates the cut width by applying the aforementioned position information (a) to (c) to the expressions (1) to (3). The cut width is calculated for each of the other cut images 1000a, 1000b, 1000d and 1000e, and an average value of these cut widths is determined as a final cut width obtained for the angle of view 1001.

Now, an eccentric state of the wafer W with respect to the holding unit 210 will be explained with reference to FIG. 15. A center position WO of the wafer W and a center position HO of the wafer holding unit 210 may be deviated in the X-axis and Y-axis directions when the substrate transfer device 17 places the wafer W on the wafer holding unit 210. For example, this phenomenon may occur due to insufficient adjustment of the substrate transfer device 17, abrasion of a constituent member resulted from a long time of usage thereof, and so forth. In the present exemplary embodiment, a deviation amount from the center position HO is defined as an "eccentric amount WD."

Figure 15:
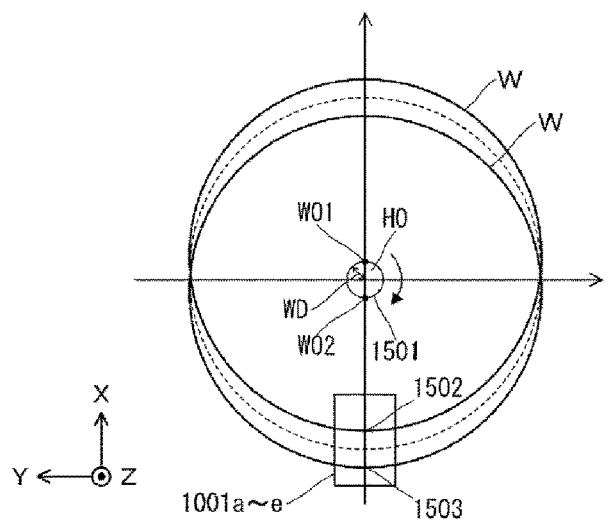
FIG. 15 illustrates an eccentric state of the wafer W with respect to a holding unit.

FIG. 15 illustrates a positional relationship between the cut regions 1000a to 1000e of the image and the wafer W. Immediately after the substrate transfer device 17 places the wafer W on the wafer holding unit 210 at a deviated position, the center position WO of the wafer W is located at somewhere on a circular ring 1501. In case that the wafer W is rotated as indicated by an arrow, the center position WO of the wafer W surely passes through positions WO1 and WO2 on the X-axis of FIG. 15.

As in the present exemplary embodiment, when the imaging device 270 is fixed and the imaging is performed while rotating the wafer W which is eccentric, there occurs a phenomenon that the position of the aforementioned wafer circumferential edge 1111 changes periodically. When viewed from the cut regions 1000a to 1000e of the image, the wafer circumferential edge 1111 is located at a position 1502 to have a minimum value when the center of the wafer W is located at the position WO1, and is located at a position 1503 to have a maximum value when the center of the wafer W is located at the position WO2.

A difference between the center positions WO1 and WO2 is equal to a difference between the maximum value and the minimum value of the wafer circumferential edge 1111. Accordingly, the eccentric amount WD can be obtained by an expression (4) of WD=(maximum value of the wafer circumferential edge 1111−minimum value of the wafer circumferential edge 1111)/2.

Figure 16:
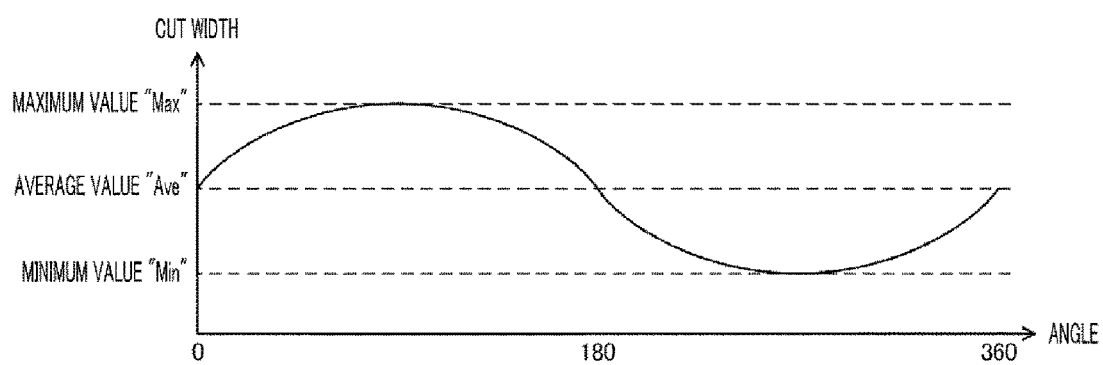
FIG. 16 is a graph showing a measurement result of the cut width with respect to a rotation angle of the wafer W.

FIG. 16 is a graph showing a measurement result of the cut width with respect to a rotation angle of the wafer W when the wafer W is rotated 360 degrees in the measurement processing shown in FIG. 12A and FIG. 12B.

Figure 7:
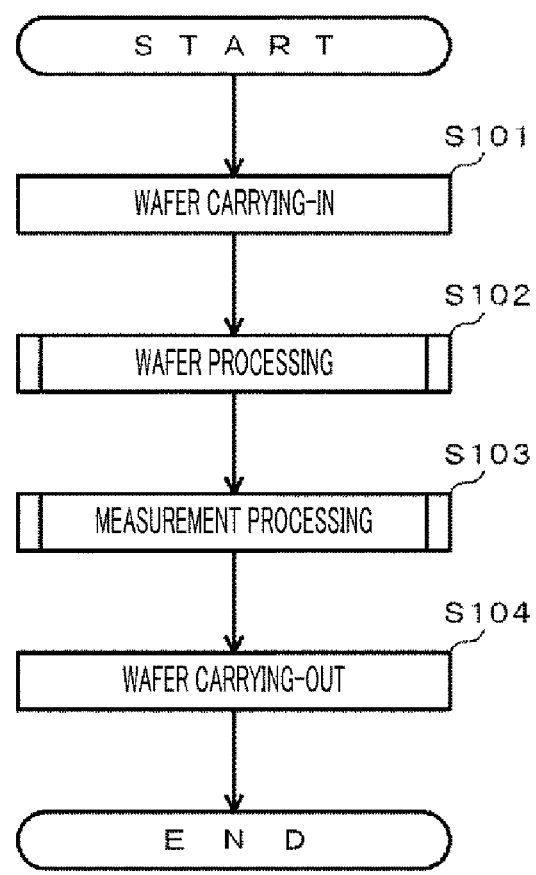
FIG. 7 is a diagram showing an overall flow of a substrate processing and a measurement processing performed by the substrate processing system and the measurement processing system according to a first exemplary embodiment.

This example shows a measurement result when the wafer processing of the process S102 of FIG. 7 is performed while the wafer W is eccentrically placed. Like the wafer circumferential edge 1111, the cut width also changes periodically depending on the angle. In the present exemplary embodiment, the measurement processing device 601 specifies an average value "Ave," a maximum value "Max," and a minimum value "Min" of the cut width from the measurement results at 360 points. Here, if the variation of the processing film boundary 1109 with respect to the periodic variation of the wafer circumferential edge 1111 in the images at the 360 points can be considered to be negligibly small, the variation amount of the wafer circumferential edge 1111 becomes dominant in the variation amount of the cut width. Thus, the eccentric amount WD can be calculated by an expression (5) of WD=(maximum value "Max"−minimum value "Min")/2.

The measurement processing device 601 sends, to the information processing device 602, the average value "Ave," the maximum value "Max," and the minimum value "Min," at 360 points which are information indicating the cut width and the eccentric amount.

The information processing device 602 generates information to be displayed on the display device 609 connected to the control device 4 based on the measurement result information received from the measurement processing device 601.

Figure 17:
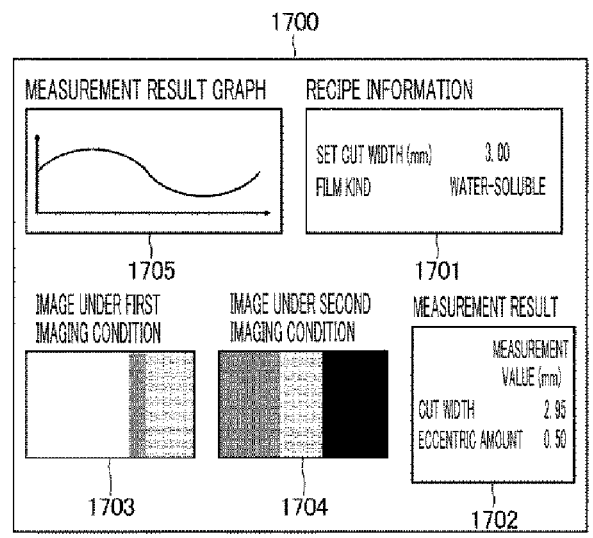
FIG. 17 is a diagram illustrating an example of a display screen showing measurement result information displayed on a display device.

FIG. 17 is a diagram illustrating an example of a display screen 1700 configured to display the measurement result information to be displayed on the display device 609. A recipe information window 1701 displays set values of a chemical liquid processing to be performed on the wafer W which is a measurement processing target. For example, the recipe information window 1701 may display a set value of the cut width. The recipe information window 1701 also displays the film kind on the wafer W to be processed.

A measurement result window 1702 displays the cut width obtained as the measurement result, here, the average value "Ave." Further, the measurement result window 1702 also displays the eccentric amount WD calculated by the expression (5).

A first image window 1703 and a second image window 1704 are configured to display the images obtained under the first imaging condition and the second imaging condition, respectively, for checking.

A graph window 1705 is configured to visualize the various measurement results such as the variation of the cut width depending on the angle shown in FIG. 16, for example, and investigate the characteristic thereof.

The cut width obtained in the present exemplary embodiment is used as information for adjusting the processing liquid supply unit 250 of the processing unit 16, for example. A user of the system may fine-adjust the position of the chemical liquid nozzle 208, for example, based on a difference value between the previously set cut width and the actually measured cut width. Further, as will be described later in a second exemplary embodiment, if the eccentric amount is obtained, a holding position adjustment for the wafer W can be performed.

As stated above, according to the present exemplary embodiment, the opening 510 of the imaging device 270 is located in front of (ahead of) the arrival region 902 of the processing liquid on the wafer W in the first rotational direction $R_1$. With this configuration, even if the imaging device 270 is provided at the cover member 230 to image the peripheral portion of the wafer W while holding the wafer W, the imaging device 270 can be suppressed from being covered with the liquid, so that the imaging can be performed successfully. Further, the imaging device 270 is provided by notching a part of the cover member 230 and is disposed to have the same cross section as that of the cover member 230 at other positions. In this way, by allowing the imaging device 270 to have the same shapes of the inner side surface and the bottom surface as those of the cover member 230, the disturbance of the air flow or the like can be avoided in the vicinity of the imaging device 270, so that the liquid processing can be performed successfully.

First Modification Example of First Exemplary Embodiment

As a first modification example of the above-described first exemplary embodiment, two cases of system configuration regarding a focus adjustment will be explained.

First, a focus adjustment by manipulating the adjusting member 505 of the imaging device 270 shown in FIG. 5 will be explained. The focus adjustment by the user can be rapidly performed while checking whether the wafer W is well focused by seeing the image in real time. In the present exemplary embodiment, the image is displayed on the display device 609.

To elaborate, while the focus adjustment operation is being performed, the imaging controller 515 acquires the images of the wafer W consecutively at a frame rate of, e.g., 5 fps by operating the imaging sensor 503, and then, sends the acquired images to the measurement processing device 601. The measurement processing device 601 processes the received consecutive images such that they can be displayed on the display device 609, and then, sends the processed images to the control device 4. The control device 4 allows the received images to be displayed on the first image window 1703 or the second image window 1704 shown in FIG. 17, for example. In this case, the display device 609 need not be configured as one body with the housing of the substrate processing system 1 but may be configured as a portable terminal device connected to the substrate processing system 1 via wire or wirelessly to improve convenience.

The above is the manual focus adjustment operation. This focus adjustment is performed by using a sample wafer prior to measuring an actual cut width, and cannot be performed while performing the actual measurement processing upon the wafer W as a processing target.

As a second case, a configuration in which the imaging device 270 has an auto-focusing function to perform the focus adjustment automatically, not manually, will be discussed.

Figure 5:
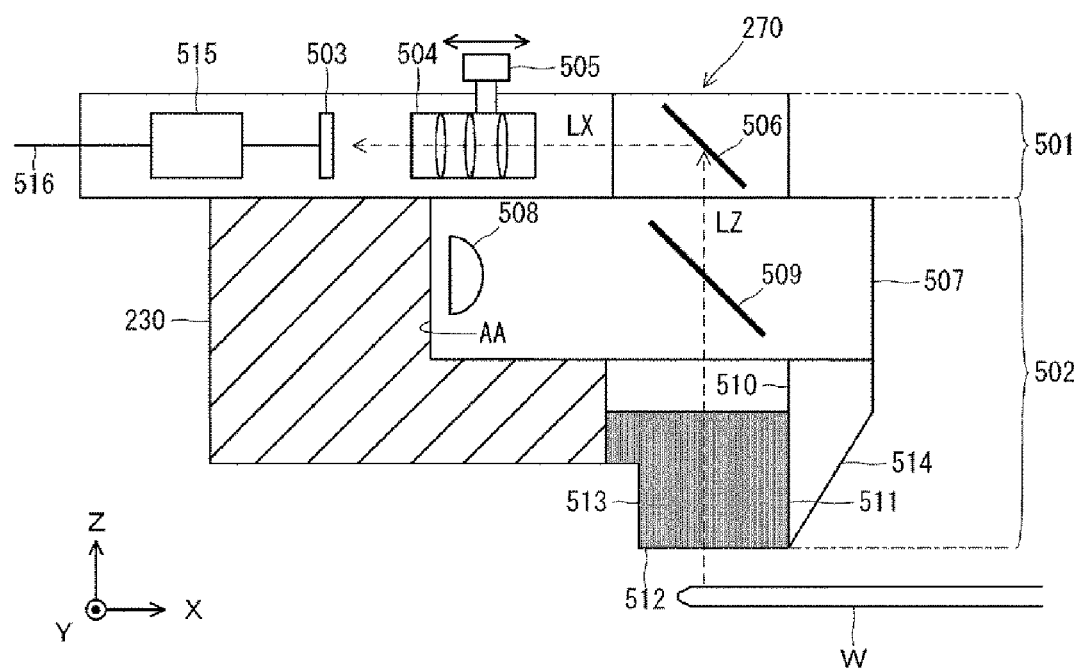
FIG. 5 is a cross sectional view illustrating a detailed configuration of an imaging device.

In this present modification example, the imaging optical mechanism 504 shown in FIG. 5 incorporates therein a non-illustrated actuator for moving the lens group automatically. The imaging controller 515 has a configuration in which the autofocus (AF) control through a contrast method can be performed. Further, the imaging controller 515 sends, to the actuator, a control signal determined based on the image obtained by the imaging sensor 503.

To elaborate, the imaging controller 515 sets an operation mode such that the imaging sensor 503 can record a moving image at a rate of, e.g., 5 fps. The imaging controller 515 acquires an AF evaluation value indicating a degree of image blur from the five cut regions shown in FIG. 10. Then, based on the AF evaluation value, the imaging controller 515 moves the lens group of the imaging optical mechanism 504 in a direction in which the image blur is decreased. While repeating the control on the consecutive frames, if it can be determined that the image blur is minimized based on the AF evaluation value, it is determined that focusing is achieved.

Referring to FIG. 12B, a measurement processing according to the present exemplary embodiment will be described. The same processing as that of the flowchart of FIG. 12A will be assigned the same numeral, and redundant description will be omitted.

In the present exemplary embodiment, after the focusing is achieved by performing the AF operation at each of the 360 points of the wafer W, the imaging is conducted.

In a process S311, as described above, the AF control by the contrast method is performed. Then, in a process S312, information at the focused position, i.e., (a) driving information of the actuator or (b) lens position information, (C) a time that has elapsed from the beginning of the AF control until the focusing is achieved, and so forth are stored. Thereafter, the imaging operation already described in the process S302 is performed.

By performing the above-describe control, it is possible to acquire the image of which focus is well-adjusted at each of all imaging positions, so that the measurement processing can be performed highly accurately. Furthermore, by analyzing the AF information (a), (b) and (c) obtained in the process S312, the characteristic of the wafer W can also be investigated. By way of example, in case that the AF information varies periodically depending on the angle, as in the example of the cut width shown in FIG. 16, there is a likelihood that a distance between the wafer W and the imaging device 270 changes periodically. If the distance varies periodically, it implies that the wafer W is highly likely to be bent (deformed). In such a case, user's attention may be called through the display device 609.

Second Modification Example of First Exemplary Embodiment

As a second modification example of the above-described first exemplary embodiment, there will be described an example where the measurement processing or the wafer processing is additionally performed in the whole process flow of FIG. 7. Assume that, as the measurement result in the process S103 of FIG. 7, the cut width does not form a smooth curved line as in FIG. 16 but includes a multiple number of small irregularities which appear several times (not shown). Since this phenomenon occurs especially when the processing film boundary 1109 is not regular in the diametrical direction, this means that the processing film is not removed in a uniform width in the circumferential direction and there exist partial film residues. The partial film residues may be caused due to an insufficient processing time of the chemical liquid processing, not due to insufficient accuracy in setting the nozzle position. Thus, if the small irregularity is found in the measurement result of the cut width, there is performed a control of repeating the same chemical liquid processing one more time. As a result, since a sufficient amount of chemical liquid is supplied to the remaining film again, the film residues can be easily removed. Thus, a fine processing result of the wafer W as the measurement target can also be obtained.

To elaborate, after the measurement processing of the process S103 in the overall flow of FIG. 7, the controller 603 of the measurement processing device 601 automatically recognizes presence or absence of the irregularity by creating a graph of the cut width as shown in FIG. 16. If any irregularity is found, that is, if it is determined that the film residues exist, this is notified to the control unit 18. Then, the control unit 18 controls the processing unit 16 to perform the wafer processing of the process S102 again.

Furthermore, between the first rinsing processing (process S202) and the second chemical liquid processing (process S203) in the wafer processing of the process S102, for example, the measurement processing of the process S103 may be additionally performed alone or along with the aforementioned wafer processing. Accordingly, the cut width formed by the first chemical liquid processing (process S201) can be recognized separately, and then, the nozzle position can be adjusted based on this result. Alternatively, by performing the first chemical liquid processing additionally as stated above, the film residues may be removed.

Second Exemplary Embodiment

In the first exemplary embodiment, the eccentric amount WD is measured by using the imaging device 270. Based on this eccentric amount WD, it is possible to automatically adjust a holding position of the wafer W. In the second exemplary embodiment, an operation of a case where a holding position adjusting device is provided within the processing unit 16 is described.

Figure 18A:
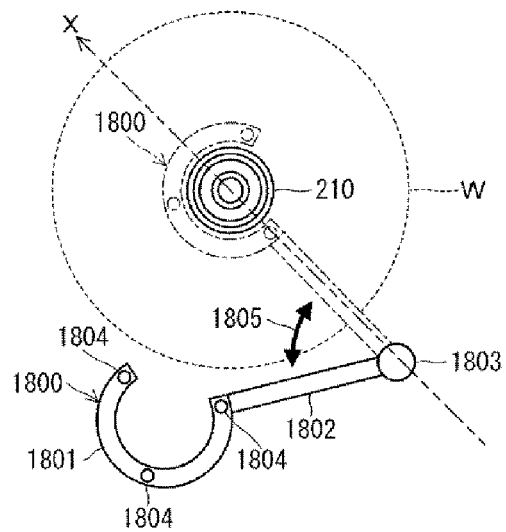
FIG. 18A and FIG. 18B are diagrams for describing a configuration of a holding position adjusting device.
Figure 18B:
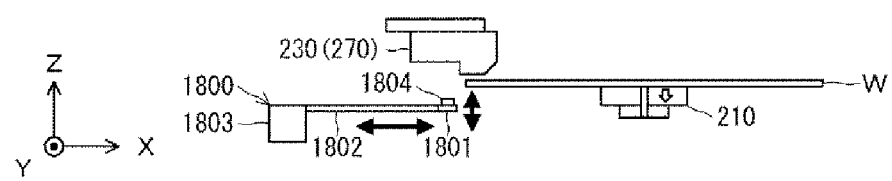

FIG. 18A and FIG. 18B are diagrams for describing the holding position adjusting device provided in the processing unit 16 of the present exemplary embodiment. This device may be provided in a space under the processing liquid supply units 250A and 250B shown in FIG. 3, and within the housing 260 of the processing unit 16 shown in FIG. 2, for example.

FIG. 18A illustrates the holding position adjusting device 1800 viewed from thereabove. Though the wafer W is indicated by a dashed line for the convenience of illustration, the wafer W is located above the holding position adjusting device 1800.

The holding position adjusting device 1800 includes a hand portion 1801, an arm portion 1802 and a supporting/rotating portion 1803. The hand portion 1801 is an arc-shaped supporting member having a size capable of surrounding the holding unit 210. Three protruding members 1804 configured to be brought into direct contact with the rear surface of the wafer W are provided on a surface of the hand portion 1801. The shape of the hand portion 1801 is not limited to the arc shape as long as it has a curved shape (including an angular shape such as a one-side-opened rectangular shape) having a size capable of surrounding the holding unit 210.

The arm portion 1802 is connected to one end of the hand portion 1801, and is configured to move the hand portion 1801 horizontally along a single axis line. The supporting/rotating portion 1803 is connected to the other end of the arm portion 1802, and is configured to support the arm portion 1802 and rotate, by driving a non-illustrated motor, the hand portion 1801 and the arm portion 1802 as one body in a direction indicated by an arrow 1805. With this configuration, the hand portion 1801 can be moved between a position (a state shown by a dashed dotted line in FIG. 18A) where it surrounds the holding unit 210 and a retreat position (a state shown by a solid line in FIG. 18A). Furthermore, the hand portion 1801 and the arm portion 1802 can also be moved up and down as one body. In FIG. 18A, a dashed double-dotted line indicates the X-axis direction, and the imaging device 270 is also located on this straight line, though not shown.

FIG. 18B is a side view illustrating the holding position adjusting device 1801 when viewed from the transversal direction. By raising the protrusion portion 1804 higher than the top surface of the holding unit 210, the protrusion portion 1804 can be brought into contact with the wafer while lifting it up, and by lowering the protrusion portion 1804 lower than the height of the holding unit 210, the wafer can be transferred onto the holding unit 210. Further, as shown by an arrow, the arm portion 1802 is configured to be linearly moved forwards and backwards in the X-axis direction. Thus, the position of the arm portion 1802 can be changed linearly in the forward/backward direction.

Now, referring to flowcharts of FIG. 19 and FIG. 20, a holding position adjusting processing according to the present exemplary embodiment will be explained.

Figure 19:
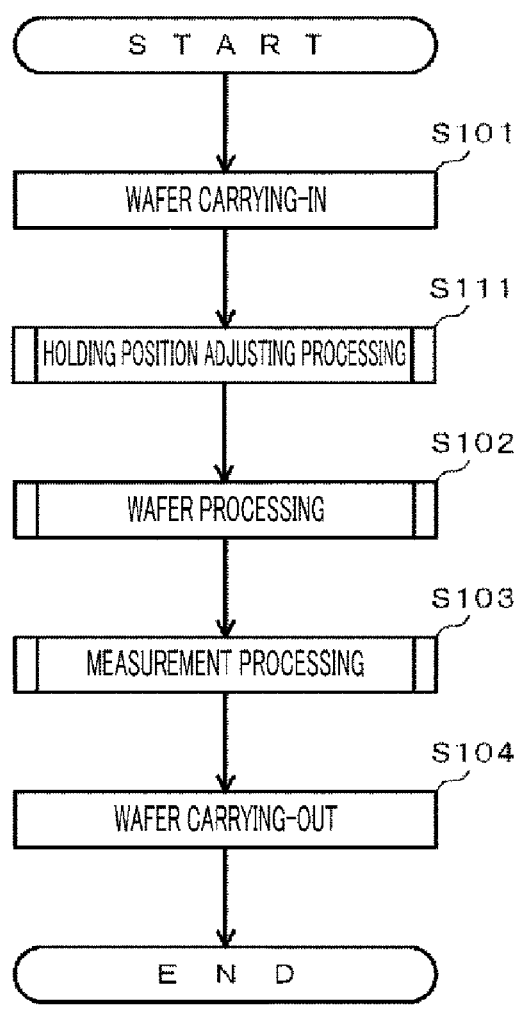
FIG. 19 is a diagram for describing an overall flow according to a second exemplary embodiment.

As shown in the overall flow of FIG. 19, the holding position adjusting processing according to the present exemplary embodiment is additionally performed after the wafer carrying-in processing of the process S101 in the overall flow of FIG. 7 described in the first exemplary embodiment. In FIG. 19, since the other processings except the holding position adjusting processing of the process S111 are the same as those described in FIG. 7, redundant description will be omitted. Below, details of the process S111 will be discussed with referent to the flowchart of FIG. 20.

Figure 20:
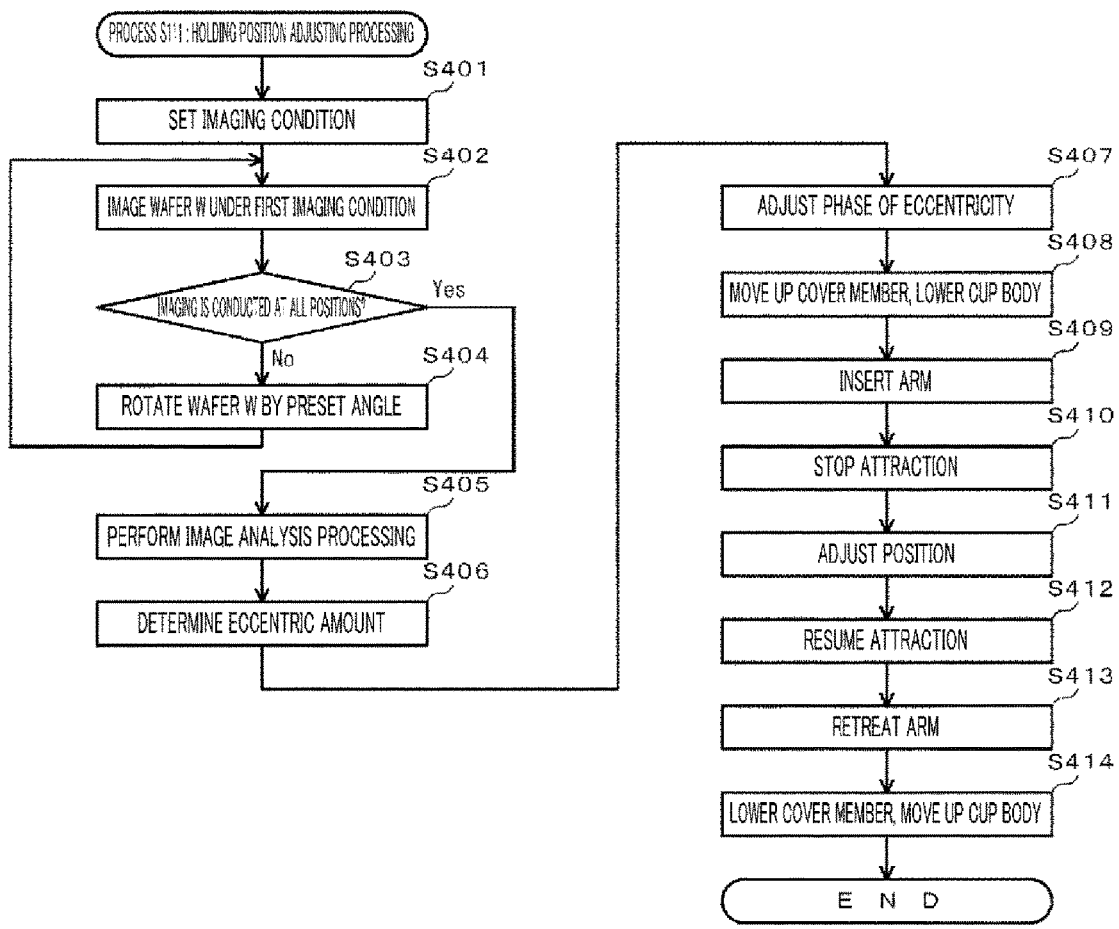
FIG. 20 is a flowchart for describing a holding position adjusting processing according to the second exemplary embodiment.

Referring to FIG. 20, the first imaging condition is set as the imaging condition of the imaging device 270 (process S401). Then, the imaging of the wafer W under the first imaging condition (process S402), the determining of the number of imaging operations (S403) and the rotating of the wafer W (S404) are repeated as many times as a preset number of imaging operations. Since these processings are the same as the repeated processings from the process S301 to the process S305 shown in FIG. 12A and FIG. 12B except the imaging operation (process S303) under the second imaging condition, detailed description thereof will be omitted here. As stated in the first exemplary embodiment, only the position of the wafer circumferential edge 1111 is required to know the eccentric amount WD, the imaging is conducted only under the first imaging condition.

If the above-described operations are finished (process S403: Yes), a process S405 is performed, and an image analysis processing is performed by using 360 sets of the first images (S405). Then, the eccentric amount WD is determined as a measurement result (process S406). Since details of the image analysis processing for calculating the eccentric amount WD is already described in FIG. 15 according to the first exemplary embodiment, description thereof will be omitted here. Here, however, it is also stored when the wafer circumferential edge 1111 takes the maximum value and the minimum value. By way of example, if the wafer circumferential edge 1111 has the maximum value at the $60^{th}$ time of the imaging operation and the minimum value at the $240^{th}$ time of the imaging operation, when the wafer W is placed on the holding unit 210, a vector of the eccentric amount WD, that is, a direction of the deviation is oriented toward a direction in which the wafer is rotated—60 degrees from the initial rotation position in the process S401.

Subsequently, a process of adjusting (correcting) the position of the wafer W based on the eccentric amount WD is begun. From here, an operation of the holding position adjusting device 1800 will be explained with reference to FIG. 21A to FIG. 21H.

First, an operation of adjusting a phase of the eccentricity of the wafer W (S407). If the rotating operation of the holding unit 210 is not performed from when the 360 times of the imaging operation are ended in the process S403, the holding unit 210 is located at the initial rotation position of the process S401. In this case, the wafer W is rotated by a rotation angle at which the wafer circumferential edge 1111 takes the maximum value. In the aforementioned example, the wafer W is rotated by 60 degrees from the initial rotation position. As a result, the direction of the vector of the eccentric amount WD and the X-axis direction are made to be coincident, and the holding position adjusting device 1800 is capable of adjusting the wafer W to an appropriate position with a simple control operation of moving the wafer W by the eccentric amount WD in parallel with the X-axis direction.

Thereafter, the cover member 230 (imaging device 270) which is in a state shown in FIG. 21A is moved to the retreat position (position above that shown in FIG. 2) by the elevating device 240, and the cup body 220 is lowered by the lifter 243 of the cup elevating device (process S408). Here, the holding unit 210 is still attracting and holding the wafer W (as indicated by a white downward arrow).

Afterwards, as depicted in FIG. 21B, by operating the holding position adjusting device 1801, the arm portion 1802 is advanced into a space between the wafer W and the cup body 220 while being rotated, and the hand portion 1801 is located under the wafer W (S409). Afterwards, the holding unit 210 stops the attraction of the wafer W (S410).

Then, based on the eccentric amount WD determined in the process S406, the position adjustment of the wafer W is performed (S411). First, as shown in FIG. 21C, the supporting/rotating portion 1803 raises the arm portion 1802 and brings the protrusion portion 1804 of the hand portion 1801 into contact with the rear surface of the wafer W. At this time, the hand portion 1801 supports a region of the rear surface of the wafer W outside a region in contact with the holding unit 210, as depicted in FIG. 18A and FIG. 18B. Further, as illustrated in FIG. 21D, the hand portion 1801 and the arm portion 1802 are raised, so that the holding unit 210 is released from the contact with wafer W. Then, as shown in FIG. 21E, the arm portion 1802 is moved as much as the eccentric amount WD.

Thereafter, the arm portion 1802 is lowered, and the wafer W is brought into contact with and attracted to the holding unit 210 again (S412), as shown in FIG. 21F. Further, as illustrated in FIG. 21G, by lowering the arm portion 1802 further, the arm portion 1802 is released from the contact with the wafer W.

Then, as depicted in FIG. 21H, the arm portion 1802 is retreated (S413). Finally, the cover member 230 is lowered by the elevating device 240, and the cup body 220 is moved upward by the lifter 243 of the cup elevating device to return back to the position shown in FIG. 2, so that the series of the processings are ended (S414).

As stated above, according to the present exemplary embodiment, there is provided the holding position adjusting device 1800 configured to adjust the holding position of the wafer W with respect to the center of the holding unit 210 based on the eccentric amount of the wafer W which is determined based on the images obtained by the imaging device 270. This holding position adjusting device 1800 adjusts the holding position of the wafer W while supporting the wafer W from the rear surface thereof. Since the holding position adjusting device 1800 adjusts the position of the wafer W under the wafer W, a space for providing the holding position adjusting device within the housing can be reduced, as compared to a conventional case where the position adjustment of the wafer W is performed while holding the peripheral end portion of the wafer W and performing the position adjustment in a transversal direction. Accordingly, the position adjustment can be well performed without causing an increase of a footprint of an apparatus. Furthermore, since the wafer W is supported from below by the protrusion members 1804 of the hand portion 1801, the position of the wafer W can be appropriately adjusted stably without causing damage on the circumferential edge portion of the wafer W. In addition, since the position adjustment is performed while supporting the rear surface of the wafer W at the region outside the region where the wafer W is in contact with the holding unit 210, a sufficient uplift amount can be obtained just by lifting the wafer W slightly apart from the holding unit 210. Thus, it is not necessary to secure a space in the Z-axis (vertical) direction in order to perform the position adjustment in the structure of the processing unit 16. Furthermore, since the eccentric direction is specified by rotating the wafer W in advance and the position adjustment is performed after rotating the wafer W such that the eccentric direction coincides with the direction (X-axis direction) of the linear movement of the arm portion 1802, the holding position adjusting device can be controlled simply and accurately.

Third Exemplary Embodiment

In the above-described exemplary embodiments, the measurement processing device 601 conducts image setting of the imaging device 270 prior to starting the measurement processing. However, this may be modified depending on a wafer as a measurement target or the content of a processing involved.

The wafer as a measurement target may be of various kinds. By way of example, the wafer may have a water-soluble film or a metal film such as titanium, aluminum or tungsten. Since these films have their own refractive indexes or attenuation factors, they exhibit different reflection characteristics of light. Therefore, even if the imaging is performed under the same imaging condition by the imaging device, the luminance levels of edges shown on the image may be different.

In the first exemplary embodiment, as the second imaging condition, the imaging condition in which an emphasis is put on a reflection light level of an intermediate illumination level is set to accurately specify the position of the processing film boundary 1109 in the film structure shown in FIG. 11.

However, the reflection characteristic of light differs on the kind of the film. Thus, even with the reflection light level of the intermediate illumination level, there may be a case where an accurate edge detection can be performed by allowing an intermediate illumination level at a low illumination level side to have a wide gradation width, or, to the contrary, a case where an accurate edge detection can be performed by allowing an intermediate illumination level at a high illumination level side to have a wide gradation width.

Furthermore, though the round of the wafer W is formed from a base thereof, the reflection characteristic of the light is differed if the material of the wafer itself is different. Thus, there may be a case where successful detection can be performed by changing the first imaging condition depending on the kind of the film.

Furthermore, there may also be a case where it is better to change the imaging condition depending on the size of the set cut width even if the kind of the film is same.

In the present exemplary embodiment, a measurement setting, which includes the imaging condition and so forth, is defined as "image processing recipe," and the image processing recipe is selected depending on the kind of the film of the wafer as a processing target. Below, the image processing recipe according to the present exemplary embodiment will be explained with reference to FIG. 22A and FIG. 22B.

FIG. 22A illustrates a table 2201 for the measurement setting showing a correspondence between a film kind and an image processing recipe. An image processing recipe 2202 is provided for each film kind 2203 and each cut width 2204. This list is previously stored in the storage unit 607 of the information processing device 602.

In the present exemplary embodiment, the imaging condition included in the image processing recipe is a condition reflected on brightness of the image, and includes setting of CCD sensitivity or setting of exposure. Further, if details of brightness/darkness of the image are changed as the size of the set cut width or the imaging condition is changed, it may be desirable to change an algorithm of the edge detection processing in correspondence to such a change. Thus, according to the present exemplary embodiment, an edge detection method of the detection processing or a method of a corresponding processing (conversion of gradation, etc.) for the edge detection may be changed.

FIG. 22B illustrates the list of image processing recipes according to the present exemplary embodiment. The list 2205 of the image processing recipes is previously stored in the storage unit 604 of the measurement processing device 601.

An image processing recipe A is provided for a processing of removing the peripheral portion of the wafer having thereon the water-soluble film by a width of 3 mm, and uses the first imaging condition as a condition 2206 for imaging the round region and the second imaging condition as a condition 2207 for imaging the processing film boundary. Further, a detection processing A is performed as the edge detection processing 2208.

In a processing of removing the peripheral portion of the wafer having thereon the water-soluble film by a width of 2 mm, a detection processing B and a third imaging condition optimum for detecting a narrow cut width are selected. Further, in case of aluminum or titanium, since both the base and the film of the wafer have different characteristics to light from the wafer having thereon the water-soluble film, the optimum imaging condition is set, or a condition in which the image processing and the detection processing can be performed is set. Furthermore, a standard image processing recipe E is also prepared for a case of processing a wafer whose film kind is unknown. By way of example, an eighth imaging condition is a condition including intermediate setting values between the first imaging condition and a fourth imaging condition, and a ninth imaging condition is a condition including setting values obtained by averaging the second imaging condition, the third imaging condition, a fifth imaging condition and a sixth imaging condition.

A processing of the present exemplary embodiment is applicable to the imaging setting performed in the process S301 of the flowcharts shown in FIG. 12A and FIG. 12B. Details of the imaging setting according to the present exemplary embodiment will be explained with reference to a flowchart of FIG. 23.

First, a wafer processing recipe is specified by receiving from an external device or according to a manipulation input from the manipulation device 601. The specified wafer processing recipe is sent from the control device 4 to the information processing device 602. In the information processing device 602, the controller 606 acquires the wafer processing recipe (S501).

Subsequently, the content of the acquired wafer processing recipe is read out, and information upon the film kind of the wafer W as a processing target and the cut width to be etched are specified (S502).

The controller 605 searches, from the selection table of FIG. 22A stored in the storage unit 606, the kind of the film and the cut width specified in the process S502. Since there is a set of this film kind and the cut width, a corresponding recipe A is selected (S503).

Then, the information processing device 602 sends, to the measurement processing device 601, setting instruction information instructing such that the selected recipe A is used. The controller 603 of the measurement processing device 601 reads out the recipe A from the storage unit 604 by using the received setting instruction information, and then, sends the imaging condition to the imaging controller 515. The imaging controller 515 sets the received imaging condition for a next imaging operation. Further, the controller 603 also sets the detection processing for performing the measurement processing (S504).

So far, an example of the present exemplary embodiment has been described. In case that the information upon the kind of the film is not written in the wafer processing recipe in the process S501, the information upon the kind of the film may be acquired through a different method in the process S502. For example, a non-illustrated sensor configured to detect the film kind by irradiating light to the film and receiving reflection light therefrom may be provided within the housing 260. By inspecting the carried-in wafer W directly, the controller 603 may specify the kind of the film of the wafer W.

As stated above, according to the third exemplary embodiment, information upon the kind of the film of the wafer W is previously acquired, and a measurement setting corresponding to the kind of the film is selected from a multiple number of measurement settings previously stored in the storage unit 607. Then, the imaging device 270 obtains an image of the peripheral portion of the wafer W by using the selected measurement setting. Thus, a measurement processing can be performed appropriately and rapidly without troubling the user to adjust the measurement setting such as the imaging condition.

Fourth Exemplary Embodiment

In a fourth exemplary embodiment, a method of analyzing information upon the measurement processing result accumulated in the information processing device 601 and utilizing this information for repair and management of the apparatus will be explained.

FIG. 24 illustrates a management list 2400 of the measurement processing result stored in the storage unit 607 of the information processing device 601.

The information of this management list 2400 includes processing recipe information 2401 which can be specified from the content of the processing recipe to be performed on the wafer W as a processing target; and measurement processing result information 2402 specified when performing the measurement with the measurement processing device 601.

The processing recipe information 2401 includes a lot ID 2403 and a wafer ID 2404 as identification information of the wafer W. Further, a set cut width 2406, a film kind 2405 related to a specific processing are also included.

The measurement processing result information 2402 includes an image processing recipe 2407 described in the third exemplary embodiment; and a date 2408 and time 2409 when the measurement processing is performed based on the image processing recipe. Further, as a result of performing the measurement processing, the measurement result information 2402 includes a maximum value "MAX" 2410, a minimum value "Min" 2411 and an average value "Ave" 2412 of results of the cut width with respect to 360 points. Further, not only the maximum value and the minimum value but all measurement values at the 360 points may also be stored.

The information processing device 601 prepares, in the storage unit 607, a folder for storing the image for the measurement processing of every single sheet of wafer W; and a folder for storing the imaging setting such as focus adjustment information of the imaging device 270 used when performing the imaging. As the measurement processing result information 2402, a link 2413 to the folder for the image and a link 2414 to the folder for the imaging setting information are also stored.

Now, a specific analysis processing and a method of repair and management with the information list of the measurement processing result will be explained.

As for a lot ID "3342," the measurement processing is consecutively performed on 25 sheets of wafers W of the same kind by using the same wafer processing recipe and the image processing recipe A. Accordingly, it can be checked whether the wafer group of a single lot is cut-processed uniformly.

As for the lot ID "3342" and a lot ID "3842," though the same kind of wafers W are processed by using the same wafer processing recipe and the image processing recipe A, the measurement processings are performed on different dates. Details of this example will be explained with reference to FIG. 25A and FIG. 25B.

Figure 25A:
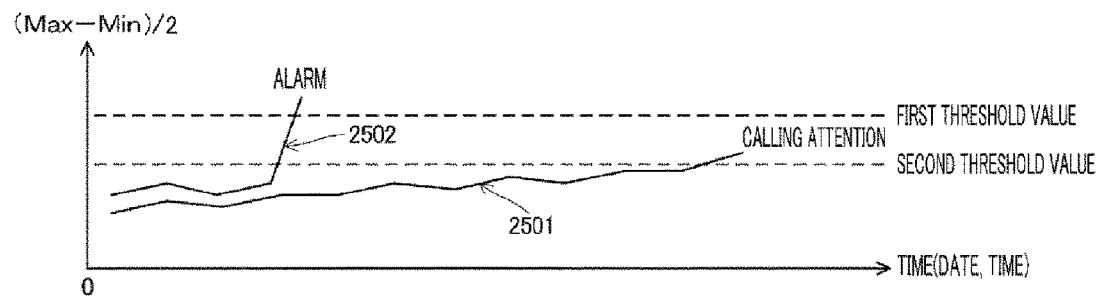
FIG. 25A and FIG. 25B are diagrams for describing a method of analyzing and utilizing the measurement processing results.

FIG. 25A presents a graph in which a vertical axis represents the eccentric amount ((maximum value "Max"−minimum value "Min")/2) and a horizontal axis indicates a date (and time) when a measurement processing is performed. The controller 606 of the information processing device 602 is capable of creating this graph based on the management list 2400.

This graph shows a change of the eccentric amount with the lapse of time. In an example of a change 2501 with the lapse of time in FIG. 25A, the eccentric amount is found to increase as time elapses. As one of reasons for this, it is deemed that the wafers W cannot be transferred accurately because of abrasion of members constituting the substrate transfer device 17.

The controller 606 of the information processing device 601 creates the graph of the change 2501 with the lapse of time and sends this graph to the control device 4. In response to a request from the user or automatically, the control device 4 displays this graph on the graph window 1705 of the display screen 1700 of FIG. 17 described in the first exemplary embodiment.

Further, an eccentric amount that is allowable in the aspect of operating the apparatus may be previously set as a first threshold value through experiment, for example, and if there comes out a result that the eccentric amount approaches the first threshold value, this may be automatically notified to the user. In the example of FIG. 25A, at a time when the eccentric amount exceeds a second threshold value smaller than the first threshold value, the display screen 1700 is configured to call user's attention such that the user may check or exchange the substrate transfer device 17. Further, it may be also possible to extract plural measurement results of the eccentric amount before reaching the second threshold value. Investigating whether these plural values has a gradient of increase may be added as a condition of determining whether to call user's attention in addition to investigating whether the eccentric amount exceeds the second threshold value.

Further, if the eccentric amount suddenly exceeds the first threshold value as in a change 2502 with the lapse of time, it is highly likely that the apparatus is abnormal. Thus, an alarm or a notice of stopping the apparatus may be given on the display screen 1700.

Figure 25B:
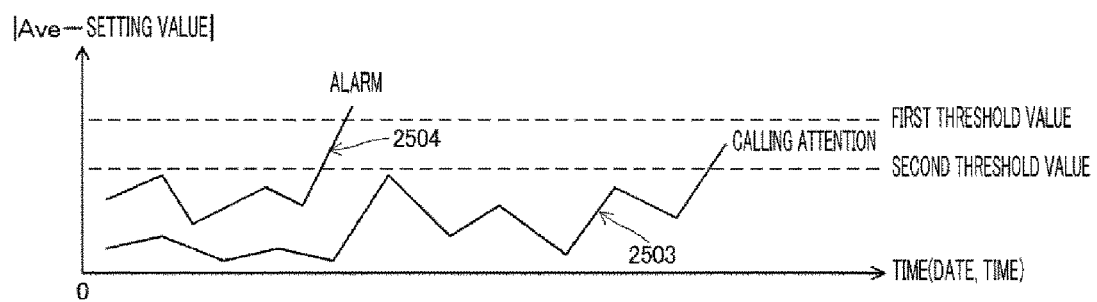

In a graph of FIG. 25B, a vertical axis represents an absolute value of a difference between an average value "Ave" which indicates an actual cut width and a set value of the cut width, and a horizontal axis represents a date (and time) when a measurement processing is conducted.

This graph shows a change in accuracy of a liquid discharge position by the processing liquid supply unit 250A (250B) with the lapse of time. In an example of a change 2503 with the lapse of time in FIG. 25B, the accuracy of the liquid discharge position is found to decrease as time elapses. As one of reasons for this, it is deemed that the liquid discharge position cannot be accurately controlled due to abrasion of members constituting the processing liquid supply unit 250A (250B). In this case, as in FIG. 25A, the graph of the change 2403 with the lapse of time may be displayed on the graph window 1705 of the display screen 1700 in response to a request from the user or automatically. Furthermore, when the eccentric amount exceeds the second threshold value, user's attention may be called. In addition, as in the example of FIG. 25A, it may also be added as a condition of determining whether to call user's attention whether plural absolute values of the difference has a gradient of increase.

Furthermore, if the eccentric amount suddenly exceeds the first threshold value as in a change 2504 with the lapse of time, it is highly likely that the apparatus is abnormal. Thus, an alarm or a notice of stopping the apparatus may be given on the display screen 1700.

Figure 26:
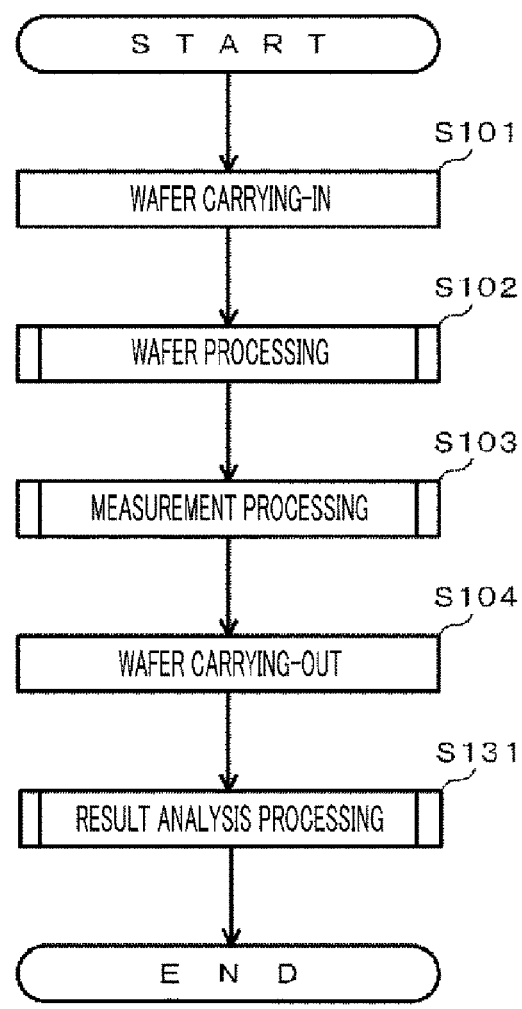
FIG. 26 is a diagram for describing an overall flow according to a fourth exemplary embodiment.

An overall flow of the system according to the present exemplary embodiment is shown in FIG. 26. As shown in this figure, a result analysis processing of a process S131 is added to the flowchart of FIG. 7. Thus, description of the processes S101 to S104 will be omitted here.

Figure 27:
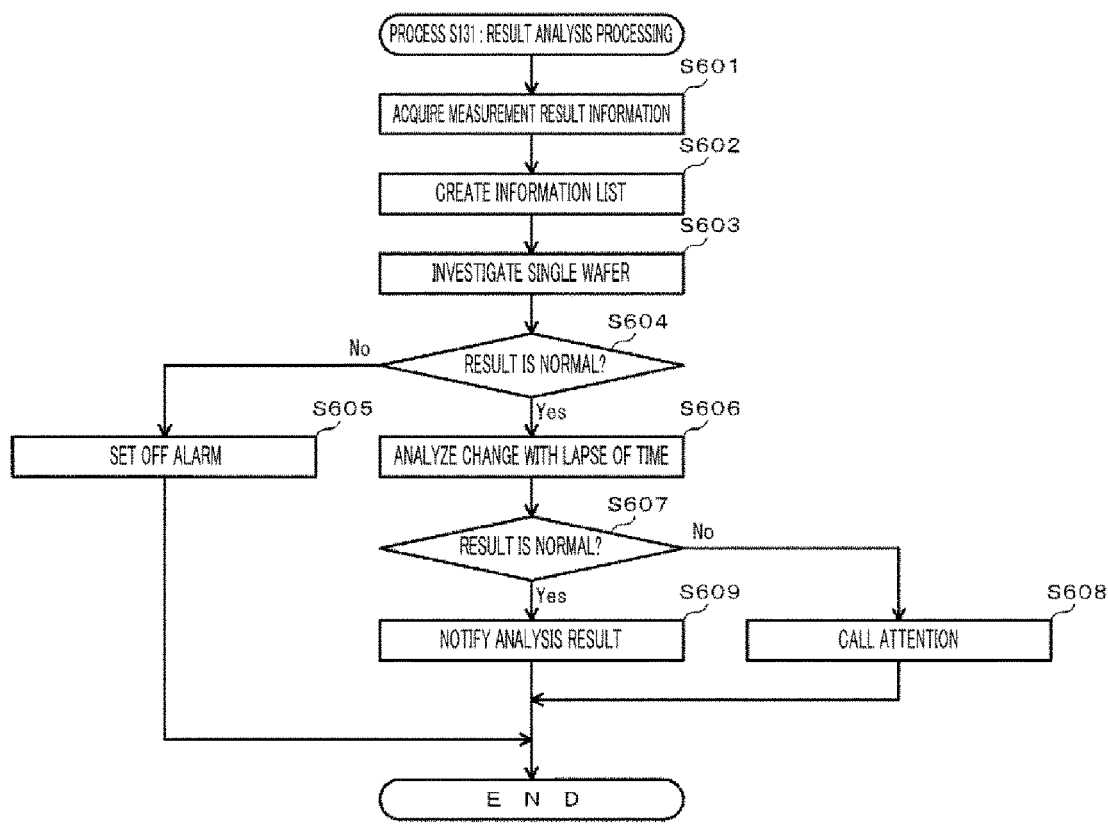
FIG. 27 is a flowchart for describing an analyzing processing of a measurement processing result according to the fourth exemplary embodiment.

Now, details of the result analysis processing of the process S131 will be explained with reference to a flowchart of FIG. 27.

First, the information processing device 602 acquires the measurement result information from the measurement processing device 601 (S601). The information acquired here is the measurement processing result information 2402 shown in FIG. 24.

Then, the information acquired in the process S601 is stored in the storage unit 607, and the management list 2400 shown in FIG. 24 is created (S602). Here, since the processing recipe information 2401 is already acquired before the measurement processing, an operation of relating the processing recipe information 2401 and the measurement processing result information 2402 is conducted. If a list is already created, the management list 2400 is updated by adding the current measurement processing result information.

As a processing of analyzing a processed state of a wafer W, it is investigated whether an eccentric amount of the single sheet of wafer W as a current measurement result exceeds a preset first threshold value (S603). Here, if it is determined that the eccentric amount exceeds the first threshold value (S604: No), an alarm is set off (S605), and, for example, the apparatus is stopped to cope with abnormality.

Likewise, as a processing of analyzing the processed state of the wafer W, it is investigated whether the difference between the actual cut width and the set value of the cut width exceeds a first threshold value (S603). If it is found out that the difference exceeds the first threshold value (S604: No), an alarm is set off (S605), and, for example, the apparatus is stopped to cope with abnormality.

Meanwhile, if it is determined that the above value does not exceed the first threshold value, an analysis of a change with the lapse of time is conducted (S606) as a processing of analyzing the processed state of the wafer W. Here, as stated above, it is determined whether the eccentric amount or the cut width exceeds a second threshold value, and, if so (S607: No), a notification is made to call user's attention through the display screen 1700 (S608).

If there is no special abnormality, a graph created to notify the analysis result is displayed on the graph window 1705 of the display screen 1700 (S609). The graph may be displayed concurrently with the setting-off the alarm (S605) or the calling of the user's attention (S608).

As described above, according to the present exemplary embodiment, the information processing device 602 creates the management list 2400 including the processing recipe information 2401 and the measurement processing result information 2402. The processed state of the substrate is analyzed based on this management list 2400, and a preset notification is made to the user according to the analysis result. In this way, by managing the information upon the removal of the film on the peripheral portion of the wafer W, the processing unit 16 can be operated stably for a long time. Particularly, a problem or an abraded state and deteriorated state of the processing liquid supply unit 250 or the substrate transfer device 17 can be found out from the cut width or the eccentric amount, and repair or exchange of the members can be conducted at an appropriate timing.

Fifth Exemplary Embodiment

In the first to fourth exemplary embodiments, the measurement processing is performed before or after the chemical liquid processing to acquire the result of the wafer processing or the eccentric amount.

Meanwhile, it may be required to check a state of the wafer or the like while a liquid is actually being supplied. If a state during the liquid supply can be investigated, this can be reflected in adjusting a supply amount of a processing liquid or a nozzle position. In a fifth exemplary embodiment, an example of performing the measurement processing during the chemical liquid processing or the rinsing processing will be explained.

Figure 28:
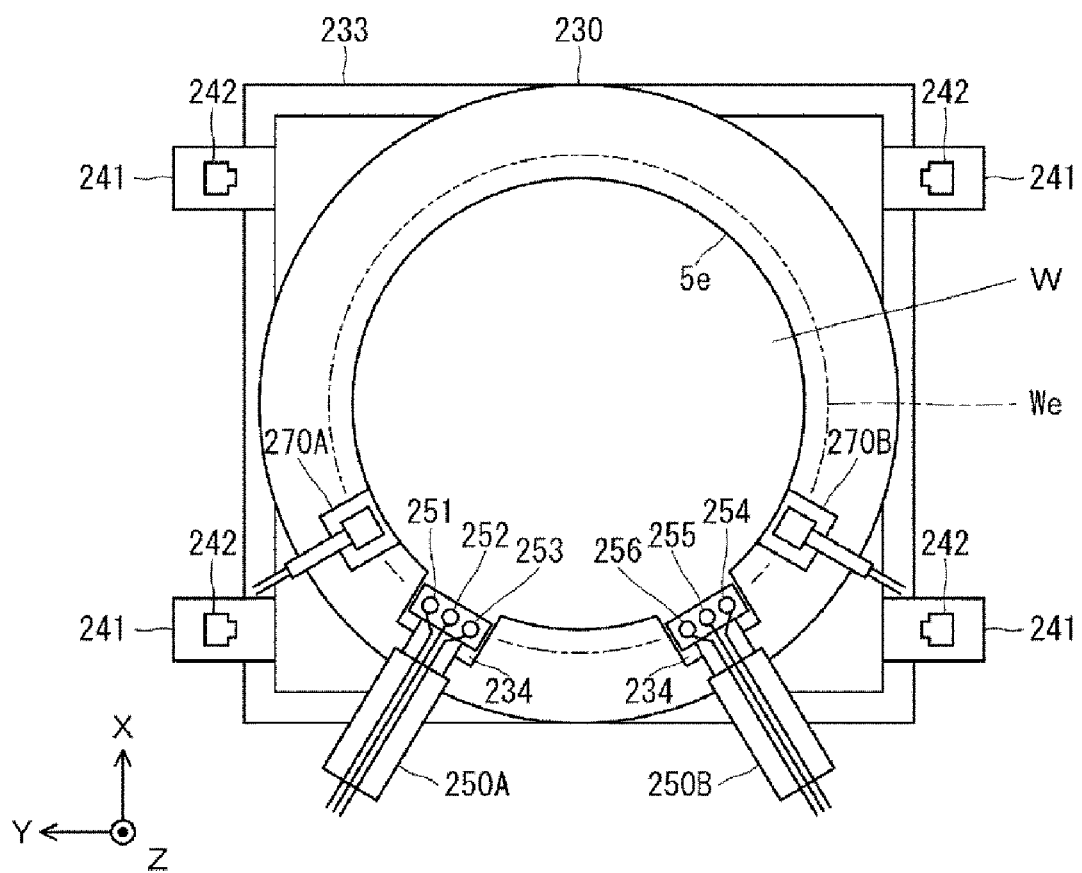
FIG. 28 is a plan view illustrating a cover member of a processing unit, an elevating device therefor and a processing liquid supply unit according to a fifth exemplary embodiment.

FIG. 28 is a plan view of a processing unit 16 according to the present exemplary embodiment. In the first to fourth exemplary embodiments, the imaging device 270 is provided between the two processing liquid supply units, and a region on the wafer W where no chemical liquid exists is imaged. In the present exemplary embodiment, as illustrated in FIG. 28, an imaging device 270A and an imaging device 270B are provided. The imaging device 270A is provided in front of the processing liquid supply unit 250A in the rotational direction $R_1$ of the wafer W to image a state where the processing liquid is supplied. Likewise, the imaging device 270B is provided in front of the processing liquid supply unit 250B in the rotational direction $R_2$ of the wafer W to image a state where the processing liquid is supplied. Furthermore, since the present exemplary embodiment is applicable as a part of the overall flow of FIG. 7 or FIG. 19 described in the prior exemplary embodiments, at least one of the imaging device 270A and the imaging device 270B is used to measure the cut width and the eccentric amount. In addition, in the present exemplary embodiment, it is assumed that an influence of a liquid adhering to or coated on the imaging device upon the imaging operation, which is discussed in the first exemplary embodiment, is negligible.

In a configuration where the imaging devices are disposed as in FIG. 28 according to the present exemplary embodiment, imaging ranges of the imaging devices 270A and 270B and a position relationship between a wafer W and a liquid thereon will be explained with reference to FIG. 29A and FIG. 29B.

Figure 29A:
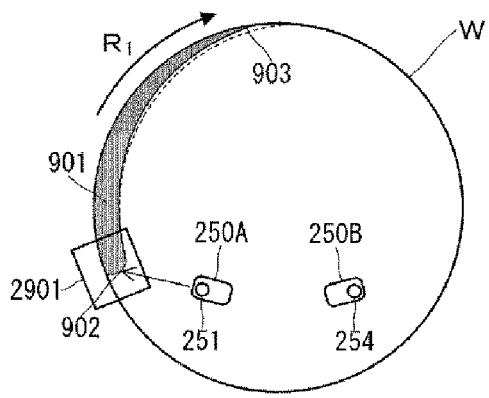
FIG. 29A and FIG. 29B are diagrams for describing a positional relationship among an imaging device, a wafer W and a liquid on the wafer W.
Figure 29B:
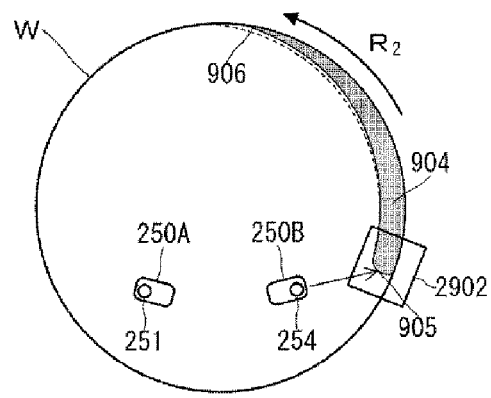

In FIG. 29A and FIG. 29B, a region 2901 indicates an imaging range of the imaging device 270A, and a region 2902 indicates an imaging range of the imaging device 270B.

Figure 30:
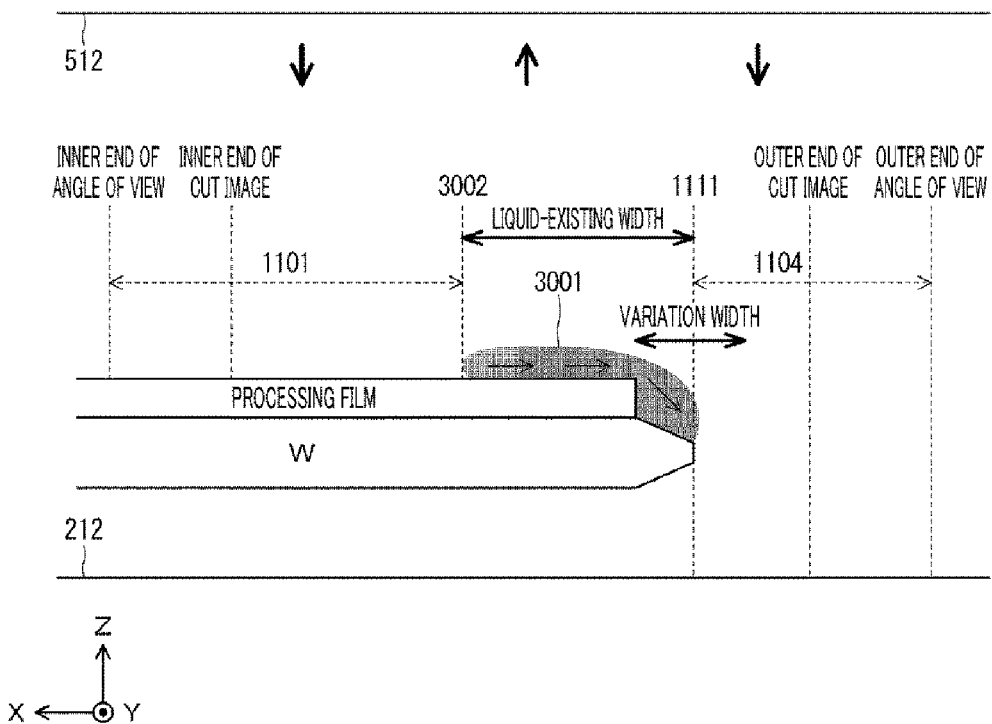
FIG. 30 is a diagram for describing an arrangement relationship of the imaging device, the processing unit and the wafer W in an imaging region and describing a liquid-existing state of a chemical liquid or a rinse liquid.

FIG. 30 is a diagram for describing an arrangement relationship between the imaging device 270, the processing unit 16 and the wafer W and the liquid-existing state of the chemical liquid or the rinse liquid at the region 2901 or the region 2902.

FIG. 30 shows a state immediately after the chemical liquid processing is begun. In this state, the processing film is not removed, and the chemical liquid 3001 exists on the processing film and the round region. Further, the imaging is performed with an arrival region 902 (905) as a center of angle of view. Theoretically, the cut width in the wafer processing recipe and the liquid-existing width of FIG. 30 may be equal, and one purpose of the present exemplary embodiment is to investigate how much these two widths are equal. For the purpose, a position of an inner end boundary 3002 of the liquid-existing and a change in the state thereof need to be imaged appropriately.

For example, it is expected that the position or the width of the inner end boundary 3002 is changed if the chemical liquid processing progresses and the processing film is removed. Thus, in the present exemplary embodiment, by recording a moving image, not by taking a still image, a liquid-existing state from the beginning of the liquid processing to the end thereof can be investigated.

Further, since a type in which the liquid exists is different depending on the rotation number or the property of the processing liquid, conditions for recording the moving image are set to be different for a first chemical liquid and a second chemical liquid. The imaging condition is set such that the edge detection between the processing film and the liquid-existing region can be performed successfully.

Figure 31:
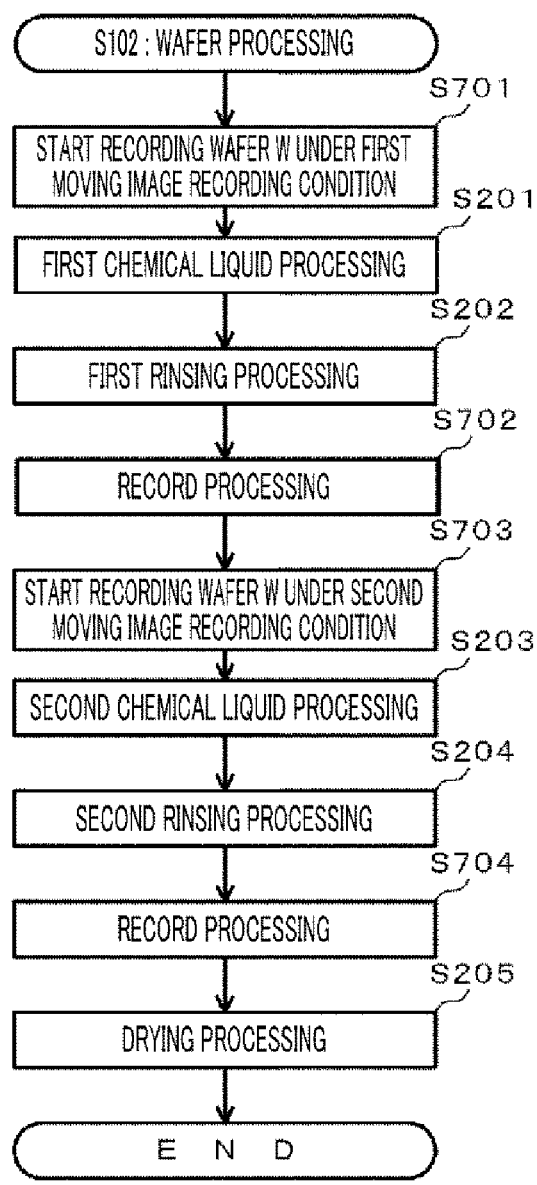
FIG. 31 is a flowchart for describing a chemical liquid processing performed along with a recording according to the fifth exemplary embodiment.

Now, the chemical liquid processing performed along with the moving image recording according to the present exemplary embodiment will be explained with reference to a flow chart of FIG. 31. In this flowchart, since the processes S201 to S205 are the same as those described in the flowchart of FIG. 8 of the first exemplary embodiment, description thereof will be omitted.

First, prior to starting the supply of the liquid, a moving image of the wafer W is recorded under a first moving image recording condition (S701). Here, the moving image recording condition is set to be optimized for the chemical liquid for use in the first chemical liquid processing and the rinse liquid for use in the first rinsing processing.

Then, the first chemical liquid processing of the process S201 and the first rinsing processing of the process S202 are begun. While performing the processes S201 and S202, the imaging device 270 continues to record the moving image under the first moving image recording condition. In the meanwhile, the measurement processing device 601 sends the recorded moving image to the control device 4 in real time, and the control device 4 displays the moving image on the first image window 1703 of the display screen 1700, for example.

Thereafter, the recording of the moving image by the imaging device 270 is temporarily stopped, and the recorded moving image is sent to the information processing device 602. The information processing device 602 performs a record processing of the moving image (S702). Details of the record processing will be described later.

Then, the imaging device 270 resumes recording of the moving image by changing to a second moving image recording condition (S703).

Then, the second chemical liquid processing of the process S203 and a second rinsing processing of the process S204 are begun. While performing the processes S203 and S204, the imaging device 270 continues to record the moving image under the second moving image recording condition. In the meanwhile, the recorded moving image is sent to the control device 4 in real time, and the control device 4 displays the moving image on the second image window 1704 of the display screen 1700.

Afterwards, the recording of the moving image by the imaging device 270 is temporarily stopped, and the recorded moving image is sent to the information processing device 602. The information processing device 602 performs a record processing of the moving image (S704). Details of the record processing will be described later.

Finally, the drying processing of the process S205 is performed, and the series of chemical liquid processing is ended.

The chemical liquid processing according to the present exemplary embodiment has been described as above. During the chemical liquid processing of the process S201, the wafer W is rotated at a high speed. In case that the wafer W is rotated at 3000 rpm, it is calculated that the wafer W is rotated 50 times for 1 second. Theoretically, the arrival region 902 (905) of the chemical liquid or the rinse liquid is not changed with respect to the angle of view. In case that the wafer W is eccentric as described in FIG. 15, a movement that the position of the wafer circumferential edge 1111 of the wafer W is rapidly changed within a "variation width" shown in FIG. 30 is repeated. A general frame rate for recording the moving image is about 30 fps. Therefore, it is difficult to accurately image the fluctuating width and observe it. To suppress this problem, it is desirable to perform the chemical liquid processing of the process S201 after removing the eccentricity by performing the holding position adjusting processing shown in the process S111 of FIG. 19. Further, the holding position adjusting processing may not be limited to the method described in the second exemplary embodiment.

Now, the record processing of the process S702 and the process S704 will be explained. A liquid-existing width during the processing can be checked as the user observes the recorded moving image. Besides, it is more desirable to use this liquid-existing width for the feedback to the setting and the control of a subsequent chemical liquid processing.

In the present exemplary embodiment, the recorded moving image is stored in the storage unit 607, and an inner end boundary 3002 is added to the measurement processing result information 2402 of the management list 2400 as the measurement processing result of FIG. 24. Accordingly, the set cut width 2406, the average value "Ave" 2412 as the actually measured cut width and the inner end boundary 3002 can be compared for every wafer. Based on the comparison result, feedback setting such as determining an offset value of each nozzle of the processing liquid supply unit 250A (250B) in a subsequent processing is enabled.

As a method of obtaining the inner end boundary 3002, if the illumination levels of the reflection light of the processing film region 1101 and the chemical liquid 3001 are sufficiently different, the inner end boundary 3002 can be obtained by acquiring the luminance edge between the processing film region 1101 and the chemical liquid 3001 on each frame of the moving image. Further, as in FIG. 30, since an outward liquid flow as indicated by an arrow is generated in a region where the chemical liquid 3001 exists, a difference between consecutive frames may be calculated, and a position in the diametrical direction where a movement direction or a magnitude of an absolute value of a variation amount of the difference changes greatly may be estimated as the inner end boundary 3002.

Here, an example of the feedback through the information upon the liquid-existing state according to the present exemplary embodiment will be explained.

Assume that the cut width is set to be 3 mm and the liquid supplying time is set to be 30 seconds in the first chemical liquid processing of the process S201. In this case, a nozzle is located at a position corresponding to the cut width of 3 mm, and the supply of the first chemical liquid is begun at a preset first flow rate. At this time, by referring to the management list 2400 later, it is found out that the average value "Ave" is 3.1 mm and there is a difference.

In the present exemplary embodiment, since the moving image for 30 seconds, which is the liquid supplying time, is stored in relation to this information, it can be investigated what actually happens on the wafer W.

By way of example, by observing the moving image, the user can find a phenomenon that the processing film on the wafer W is removed to be thinned as the processing proceeds and the first chemical liquid reaches a region of 3.1 mm at an elapsed time of 20 seconds.

With reference to this phenomenon, the user may update the recipe such that the nozzle is moved outward by 0.1 mm at the elapsed time of 20 seconds, or the amount of the first chemical liquid is reduced at the elapse time of 20 seconds, for example. Accordingly, the processing film can be suppressed from being excessively removed, and a result that the average value "Ave" is 3.0 mm as in the recipe can be obtained.

Besides the setting by the user, the automatic control by the control device 4 is also possible. Assume that the inner end boundary 3002 keeps being recorded every 1 second during the liquid supplying time of 30 seconds. The information processing device 602 analyzes the management list 2400, and if it is determined that the inner end boundary 3002 is deviated 0.1 mm at the elapsed time of 20 seconds as compared to the information recorded so far, the information processing device 602 notifies this deviation to the control device 4. In order to automatically control the nozzle position or the liquid amount in the next processing of the wafer W, the control device 4 sends an instruction to the processing unit 16 to move the nozzle position outwards by 0.1 mm at the elapsed time of 20 seconds or to reduce the amount of the first chemical liquid at the elapsed time of 20 seconds. Further, the control device 4 may also change the recipe itself as in the aforementioned case by the user or urging the user to change the recipe through the display device 609.

As described above, according to the present exemplary embodiment, the state in which the liquid exists on the peripheral portion of the wafer W can be investigated while the processing liquid is being supplied. Especially, since the boundary between the processing film and the region where the liquid exists can be specified, this can be effectively utilized as information for feedback setting of the cut width or the liquid amount.

In the above, the first to fifth exemplary embodiments have been described. These exemplary embodiments may also be applicable to special circumstances such as when starting-up the system or performing the maintenance as well as when processing the product wafer. Further, the system structure may not necessarily be fixed to the housing. For example, the imaging device may be prepared as a jig, and each device may be configured to be connected to or separated from the system at necessary timing. Further, though the respective exemplary embodiments can be implemented individually using the necessary parts of the system configurations described in the first exemplary embodiment, co-use of configurations disclosed in other exemplary embodiments is also possible. That is, to achieve a complex goal, the first to fifth exemplary embodiments can be performed in appropriate combinations.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A management method of a substrate processing apparatus including a rotating/holding unit configured to hold and rotate a substrate; a processing liquid supply unit configured to supply a processing liquid for removing a film on a peripheral portion of the substrate; and an imaging unit configured to image the peripheral portion of the substrate, the management method of the substrate processing apparatus comprising:

a recipe acquisition process of acquiring a substrate processing recipe including a set value of a cut width of the film;

a measurement processing process of measuring the cut width of the film based on an image obtained by imaging, with the imaging unit, the peripheral portion of the substrate on which the film is removed by supplying the processing liquid to the peripheral portion of the substrate based on the value of the cut width included in the substrate processing recipe while rotating the substrate by the rotating/holding unit;

a creation process of creating a management list in which the set value of the cut width of the film, a measurement value of the cut width of the film measured through the measurement processing process and time information at which a measurement result is obtained are correlated;

an analysis process of analyzing a state of the processed substrate based on the created management list; and a notification process of making a preset notification to a user based on an analysis result obtained through the analysis process.

2. The management method of the substrate processing apparatus of claim 1, wherein whether a difference between the set value and the measurement value of the cut width of the film exceeds a preset threshold value is determined in the analysis process, and if it is determined that the difference exceeds the preset threshold value, the preset notification is made in the notification process.

3. The management method of the substrate processing apparatus of claim 2,
wherein the preset threshold value includes a first threshold value and a second threshold value smaller than the first threshold value,
whether the difference between the set value and the measurement value of the cut width of the film exceeds the first threshold value and the second threshold value is determined in the analysis process, and
a content of the notification is changed in the notification process depending on which of the first threshold value and the second threshold value the difference exceeds.

4. The management method of the substrate processing apparatus of claim 2,
wherein information upon an eccentric amount of the substrate with respect to the rotating/holding unit is measured in the measurement processing process,
the measured information upon the eccentric amount is related to the management list in the creation process,
whether the eccentric amount of the management list exceeds a preset threshold value is determined in the analysis process,
if it is determined that the eccentric amount exceeds the preset threshold value, the preset notification is made in the notification process.

5. The management method of the substrate processing apparatus of claim 2,
wherein, in the notification process, a graph showing a change of the measurement result with the lapse of time is created based on the management list created in the creation process.

6. The management method of the substrate processing apparatus of claim 2,
wherein the notification is visually made by using a display device in the notification process.

7. The management method of the substrate processing apparatus of claim 3,
wherein information upon an eccentric amount of the substrate with respect to the rotating/holding unit is measured in the measurement processing process,
the measured information upon the eccentric amount is related to the management list in the creation process,
whether the eccentric amount of the management list exceeds a preset threshold value is determined in the analysis process,
if it is determined that the eccentric amount exceeds the preset threshold value, the preset notification is made in the notification process.

8. The management method of the substrate processing apparatus of claim 3,
wherein, in the notification process, a graph showing a change of the measurement result with the lapse of time is created based on the management list created in the creation process.

9. The management method of the substrate processing apparatus of claim 3,
wherein the notification is visually made by using a display device in the notification process.

10. The management method of the substrate processing apparatus of claim 1,
wherein information upon an eccentric amount of the substrate with respect to the rotating/holding unit is measured in the measurement processing process,
the measured information upon the eccentric amount is related to the management list in the creation process,
whether the eccentric amount of the management list exceeds a preset threshold value is determined in the analysis process,
if it is determined that the eccentric amount exceeds the preset threshold value, the preset notification is made in the notification process.

11. The management method of the substrate processing apparatus of claim 10,
wherein, in the notification process, a graph showing a change of the measurement result with the lapse of time is created based on the management list created in the creation process.

12. The management method of the substrate processing apparatus of claim 10,
wherein the notification is visually made by using a display device in the notification process.

13. The management method of the substrate processing apparatus of claim 1,
wherein, in the notification process, a graph showing a change of the measurement result with the lapse of time is created based on the management list created in the creation process.

14. The management method of the substrate processing apparatus of claim 13,
wherein the notification is visually made by using a display device in the notification process.

15. The management method of the substrate processing apparatus of claim 1,
wherein the notification is visually made by using a display device in the notification process.

* * * * *